(12) United States Patent
Fujiwara et al.

(10) Patent No.: US 11,444,564 B2
(45) Date of Patent: Sep. 13, 2022

(54) ACTUATOR CONTROL DEVICE

(71) Applicant: SMC CORPORATION, Chiyoda-ku (JP)

(72) Inventors: Atsushi Fujiwara, Moriya (JP); Eiji Iijima, Moriya (JP)

(73) Assignee: SMC CORPORATION, Chiyoda-ku (JP)

( * ) Notice: Subject to any disclaimer, the term of this patent is extended or adjusted under 35 U.S.C. 154(b) by 26 days.

(21) Appl. No.: 17/046,549

(22) PCT Filed: Aug. 24, 2018

(86) PCT No.: PCT/JP2018/031433
§ 371 (c)(1),
(2) Date: Oct. 9, 2020

(87) PCT Pub. No.: WO2019/198257
PCT Pub. Date: Oct. 17, 2019

(65) Prior Publication Data
US 2021/0036648 A1  Feb. 4, 2021

(30) Foreign Application Priority Data

Apr. 10, 2018  (JP) .............................. JP2018-075182

(51) Int. Cl.
*H02P 29/00* (2016.01)
*G01R 31/66* (2020.01)
*H02K 11/38* (2016.01)

(52) U.S. Cl.
CPC .............. *H02P 29/00* (2013.01); *G01R 31/66* (2020.01); *H02K 11/38* (2016.01)

(58) Field of Classification Search
CPC .......... H02P 29/00; G01R 31/66; H02K 11/38
See application file for complete search history.

(56) References Cited

U.S. PATENT DOCUMENTS 8,156,965 B2    4/2012  Kremser et al.
2013/0181671 A1  7/2013  King
(Continued)

FOREIGN PATENT DOCUMENTS

JP    H11-243651 A    9/1999
JP    2007-189878 A   7/2007
(Continued)

OTHER PUBLICATIONS

International Search Report and Written Opinion dated Oct. 16, 2018 in PCT/JP2018/031433 filed Aug. 24, 2018.
(Continued)

*Primary Examiner* — Zoheb S Imtiaz
(74) *Attorney, Agent, or Firm* — Oblon, McClelland, Maier & Neustadt, L.L.P.

(57) ABSTRACT

An actuator control device having a plurality of controller units connected to actuators, supplies electrical power to the plurality of actuators via the plurality of controller units. A connection confirmation unit confirms a connection state of the plurality of controller units, and a determination unit determines, based on a confirmation result of the connection confirmation unit, whether or not the connection state is in an allowable connection state in which supply of electrical power to the plurality of controller units is allowable.

8 Claims, 17 Drawing Sheets

(56) References Cited

U.S. PATENT DOCUMENTS

| | | |
|---|---|---|
| 2014/0048162 A1 | 2/2014 | Okamoto |
| 2015/0083260 A1 | 3/2015 | Morikawa et al. |
| 2017/0250493 A1 | 8/2017 | Iijima et al. |
| 2018/0204533 A1* | 7/2018 | Sasaki .................. G06F 1/3218 |

FOREIGN PATENT DOCUMENTS

| | | |
|---|---|---|
| JP | 2014-37873 A | 2/2014 |
| JP | 2014-115813 A | 6/2014 |
| JP | 5717073 B2 | 5/2015 |
| JP | 5778519 B2 * | 9/2015 |
| JP | 2017-157579 A | 9/2017 |
| KR | 10-2005-0057422 A | 6/2005 |

OTHER PUBLICATIONS

Office Action dated May 10, 2022, Japanese Patent Application No. 2020-537804, 6 pages.

Office Action dated Jul. 12, 2022, in Korean Patent Application No. 10-2020-7032498, w/English machine translation, 10 pages.

* cited by examiner

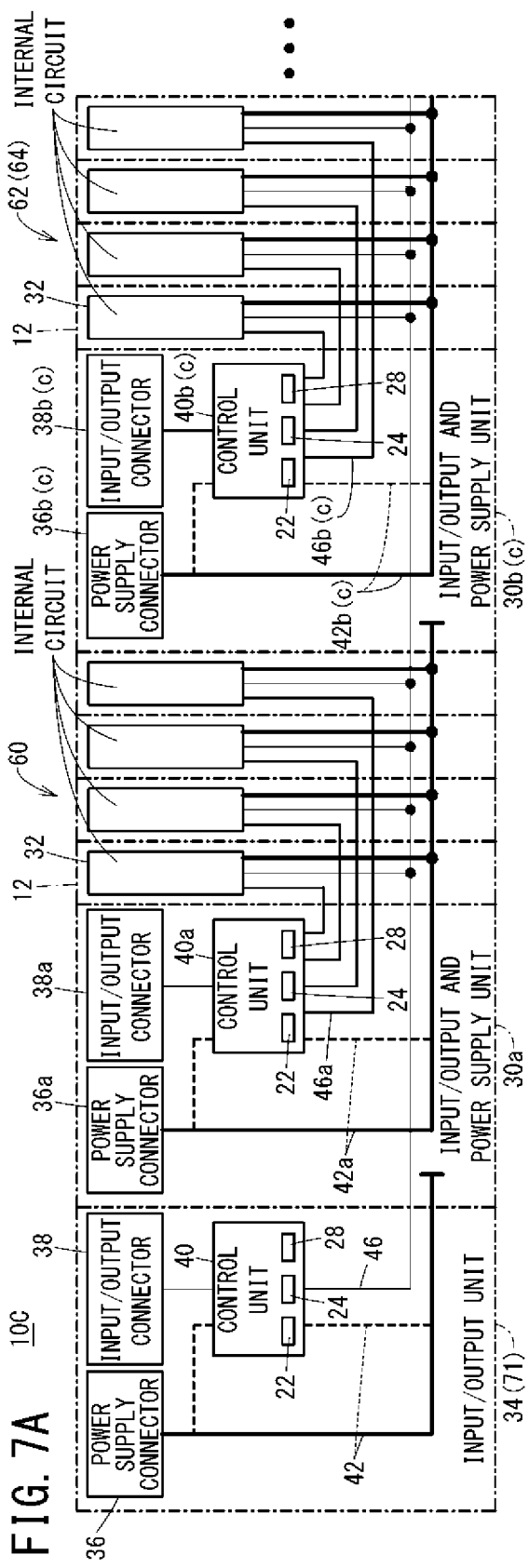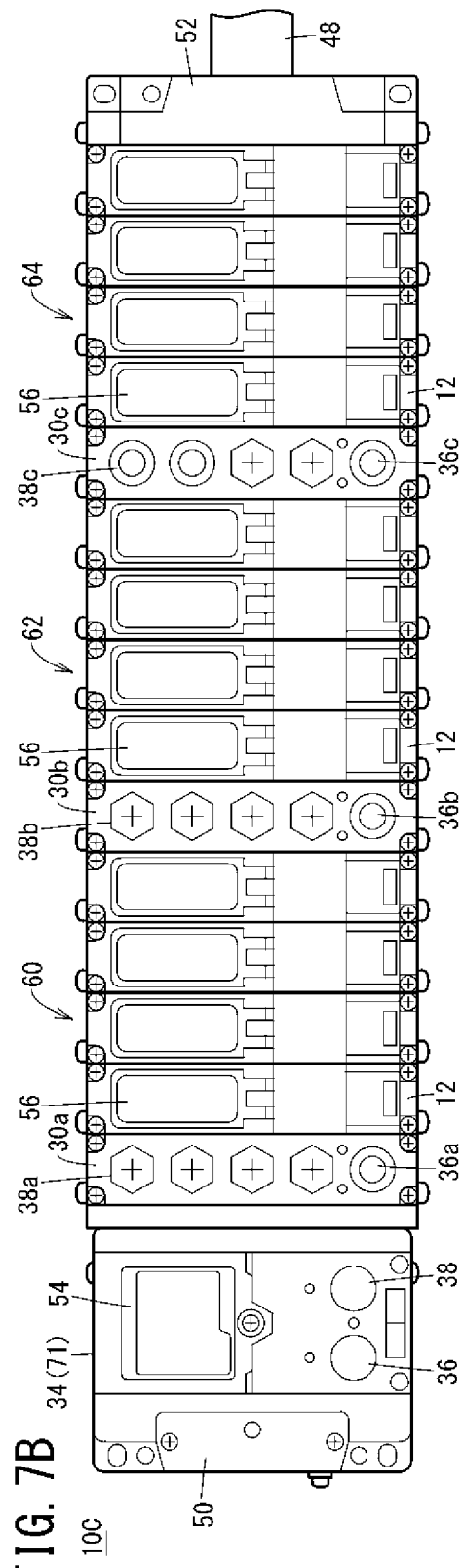

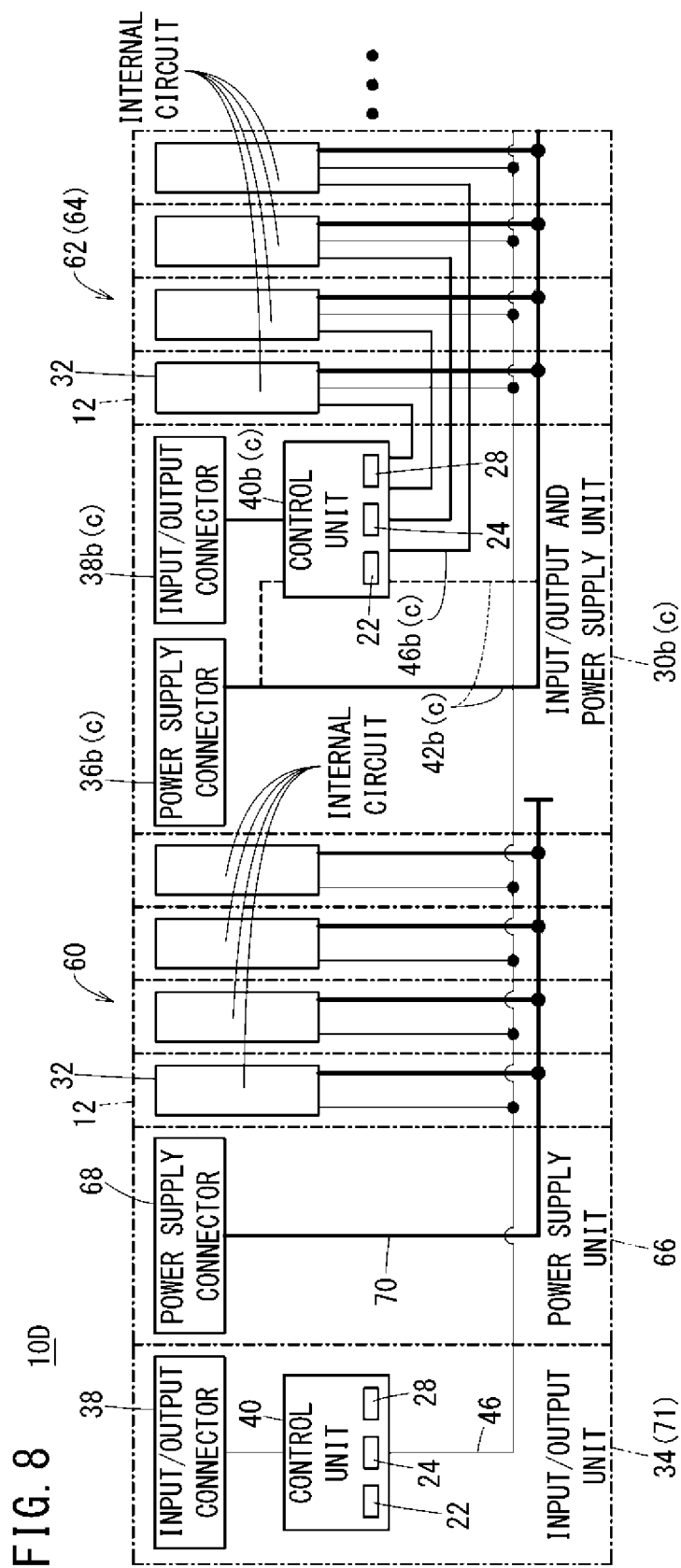

ACTUATOR CONTROL DEVICE

TECHNICAL FIELD

The present invention relates to an actuator control device having a plurality of controller units adapted to control actuators, and which supplies electrical power to a plurality of actuators via the plurality of controller units.

BACKGROUND ART

Japanese Laid-Open Patent Publication No. 2017-157579 discloses a controller assembly in which a plurality of controller units for controlling actuators are consecutively disposed and connected together in one direction, and an input unit, which carries out, by way of centralized management, supply of electrical power and input and output of signals with respect to the plurality of controller units, is connected to a controller unit on an upstream side in the connecting direction. In this case, it is described that heat, which is generated in the controller units, can be dissipated efficiently by adding heat dissipating units to the controller units.

SUMMARY OF INVENTION

Incidentally, in the case that a plurality of controller units are connected, it is necessary to maintain the number of connected controller units under a condition so that the total power consumption of the apparatus as a whole becomes less than or equal to a maximum allowable power (maximum permissible value). However, in Japanese Laid-Open Patent Publication No. 2017-157579, no mention is made concerning a maximum number, or limiting the number of controller units in consideration of the total power consumption.

Further, in the case that the controller units are connected in a manner so that the total power consumption is less than or equal to a maximum permissible value, and the apparatus is constituted with a fixed number of connected devices, then if the number of controller units that are actually used by the user is smaller than the number of connected devices, the residual controller devices that are not used become redundant and waste is generated.

The present invention has been devised taking into consideration the aforementioned problems, and has the object of providing an actuator control device, which is capable of preventing a plurality of controller units from being wastefully connected, while supplying electrical power to the plurality of controller units in a manner so that the total power consumption does not exceed a maximum permissible value.

An actuator control device according to the present invention includes a plurality of controller units connected to actuators, the controller units being configured to control the actuators that are connected thereto, wherein the actuator control device supplies electrical power to the plurality of actuators via the plurality of controller units.

In addition, as a first aspect of the present invention, the actuator control device includes a connection confirmation unit configured to confirm a connection state of the plurality of controller units, and a determination unit configured to determine, on the basis of a confirmation result of the connection confirmation unit, whether or not the connection state is in an allowable connection state in which supply of electrical power to the plurality of controller units is allowable.

Consequently, by the user consecutively disposing and connecting a necessary number of the plurality of controller units on the basis of the determination result of the determination unit, it becomes possible to control the plurality of actuators which are connected to the plurality of controller units. As a result, it is possible to add the plurality of controller units in a manner so that the total power consumption does not exceed the maximum permissible value, while preventing the plurality of controller units from being connected in a wasteful manner, and to supply electrical power to the plurality of controller units.

In this case, the connection confirmation unit may confirm a number of the plurality of controller units, and a number of the plurality of actuators that are connected to the plurality of controller units, and may output each of the confirmed numbers as connection information to the determination unit. Further, the determination unit may determine whether or not each of the numbers indicated by the input connection information is less than or equal to a maximum allowable number.

Consequently, even in the case that the user increases or decreases the respective numbers of the plurality of controller units and the plurality of actuators, the determination unit can determine highly accurately whether or not the current connection state is in an allowable connection state in which supply of electrical power to the plurality of controller units is allowable.

Further, the connection confirmation unit may obtain an expected total power consumption, which is a sum of the expected power consumptions of the plurality of controller units and the plurality of actuators corresponding to the respective numbers, and may output the obtained expected total power consumption as the connection information to the determination unit. In addition, the determination unit may determine whether or not the expected total power consumption indicated by the input connection information is less than or equal to a maximum allowable power.

In accordance with this feature, it is possible to easily predict whether or not the connection state is in an insufficient connection state in which the total power consumption of the plurality of controller units and the plurality of actuators is insufficient due to the increase or decrease in the respective numbers.

Alternatively, the actuator control device may further include a power consumption confirmation unit configured to confirm a total actual power consumption, which is a sum of actual power consumptions of the plurality of controller units and the plurality of actuators connected to the plurality of controller units, and to output a confirmation result of the total actual power consumption to the determination unit, and the determination unit may determine whether or not the total actual power consumption indicated by the input confirmation result is less than or equal to a maximum allowable power.

In accordance with this feature, it is possible to accurately and reliably determine whether or not the connection state is in an insufficient connection state in which the total power consumption of the plurality of controller units and the plurality of actuators is insufficient due to the increase or decrease in the respective numbers.

In addition, in the actuator control device, the plurality of controller units may be consecutively disposed and connected, as in the manner described below.

More specifically, the actuator control device may further include a control unit including at least the connection confirmation unit and the determination unit, and which is configured to control the plurality of controller units. In this case, the plurality of controller units may be consecutively disposed and connected in one direction, and at least one from among a power supply unit configured to supply electrical power to the plurality of actuators via the plurality of controller units, an input/output unit equipped with the control unit and configured to perform input and output of signals to and from the exterior and the plurality of controller units, and an input/output and power supply unit configured to serve dually as the power supply unit and the input/output unit, may be connected to the plurality of controller units that are consecutively disposed and connected in the one direction.

Consequently, it is possible to easily carry out the supply of electrical power from the power supply unit or the input/output and power supply unit with respect to the plurality of controller units that are consecutively disposed and connected in the one direction.

In this case, the input/output and power supply unit or the input/output unit may be connected to an upstream side controller unit in the connecting direction from among the plurality of controller units, and the connected input/output and power supply unit or the connected input/output unit may be an upper level unit configured to input and output signals to and from the plurality of controller units.

In accordance with this feature, the upper level unit can carry out, by way of centralized management, input and output of signals with respect to the plurality of controller units, as well as the determination process implemented by the determination unit. Further, since it is possible to confirm the connection state with the plurality of controller units by the connection confirmation unit that constitutes the control unit, it is also possible to specify the individual controller units that are connected to the upper level unit.

Furthermore, the power supply unit or the input/output and power supply unit may be interposed between each of an arbitrary number of controller units from within the plurality of controller units. In this case, one block is constituted by the arbitrary number of the controller units, and the interposed power supply unit or the interposed input/output and power supply unit supplies electrical power to the block that is connected on a downstream side in the connecting direction. In this instance, in the case that the upper level unit is the input/output and power supply unit, electrical power may be supplied to the block that is connected on the downstream side. On the other hand, in the case that the upper level unit is the input/output unit, the power supply unit or the input/output and power supply unit may be interposed between the input/output unit and the block that is connected on the downstream side, and electrical power may be supplied from the interposed power supply unit or the interposed input/output and power supply unit to the block that is connected on the downstream side.

Consequently, by supplying electrical power to each of the blocks, the influence of an insufficiency in the supply of electrical power to each of the controller units and the actuators due to an increase or decrease in the respective numbers of the plurality of controller units and the plurality of actuators can be reduced. Further, since it is possible to perform maintenance or initial adjustments or the like on each of the blocks, a confirmation operation of such maintenance or initial adjustments or the like is facilitated.

In this case, the interposed input/output and power supply unit is capable of inputting and outputting signals to and from the blocks that are connected on the downstream side.

In this manner, it is possible to supply signals to the controller units of each of the blocks, without supplying such signals by way of centralized management from the upper level unit. Consequently, it is possible to easily control each of the individual controller units that constitute the blocks, as well as the actuators connected to the controller units. As a result, the confirmation operation of such maintenance or initial adjustments can be performed more easily.

Further, the actuator control device according to the present invention may be configured so as not to include the connection confirmation unit, the determination unit, the power consumption confirmation unit, and the control unit.

More specifically, as a second aspect of the present invention, in the actuator control device, the plurality of controller units are consecutively disposed and connected in one direction, a power supply unit or an input/output and power supply unit is interposed between each of an arbitrary number of controller units from within the plurality of controller units, and one block is constituted by the arbitrary number of units of the controller units. In this instance, in the case that the power supply unit is interposed, the power supply unit supplies electrical power to a block that is connected on a downstream side in a connecting direction. Further, in the case that the input/output and power supply unit is interposed, the input/output and power supply unit performs input and output of signals to and from the exterior and the block that is connected on the downstream side in the connecting direction, while also supplying electrical power to the block.

In this manner, by supplying electrical power to the controller units of each block, in each of the blocks, a necessary number of the plurality of controller units are consecutively disposed and connected, and it becomes possible to control the plurality of actuators which are connected to the plurality of controller units. In this case as well, it is possible to add the plurality of controller units in a manner so that the total power consumption does not exceed the maximum permissible value, while preventing the plurality of controller units from being connected in a wasteful manner, and to supply electrical power to the plurality of controller units.

More specifically, with respect to the plurality of controller units that are consecutively disposed and connected in the one direction, supply of electrical power is carried out from the power supply unit or the input/output and power supply unit to each of the blocks, and therefore, the influence of an insufficiency in the supply of electrical power to each of the controller units and the actuators due to an increase or decrease in the respective numbers of the plurality of controller units and the plurality of actuators can be reduced. Further, it is possible to perform maintenance or initial adjustments or the like on each of the blocks, and a confirmation operation of such maintenance or initial adjustments or the like is facilitated.

Further, the input/output and power supply unit or an input/output unit may be connected as an upper level unit, which is configured to input and output signals to and from the exterior and the plurality of controller units, to a controller unit on an upstream side in the connecting direction from among the plurality of controller units. In this instance, in the case that the upper level unit is the input/output and power supply unit, electrical power is supplied to the block that is connected on the downstream side. Further, in the case that the upper level unit is the input/output unit, the power supply unit or the input/output and power supply unit is interposed between the input/output unit and the block that is connected on the downstream side, and electrical power is supplied from the interposed power supply unit or the interposed input/output and power supply unit to the block that is connected on the downstream side.

In accordance with this feature, the upper level unit can carry out, by way of centralized management, input and output of signals with respect to the plurality of controller units.

In either of the above-described first aspect or the second aspect of the present invention, the power supply unit or the input/output and power supply unit may include a switching unit configured to turn on and off supply of electrical power with respect to the block connected on the downstream side.

In accordance with this feature, it is possible to turn off the supply of electrical power only for a block that requires a confirmation operation such as maintenance or initial adjustments thereon. Therefore, concerning other blocks, by turning on the supply of electrical power thereto, control of the actuators by the controller unit is continuously performed. By turning off the supply of electrical power only in a necessary location in this manner, the confirmation operation such as maintenance or initial adjustments can be performed more efficiently and easily. Further, it is also possible to turn on or off the supply of electrical power at only one of the power supply unit or the input/output and power supply unit alone.

The above and other objects, features, and advantages of the present invention will become more apparent from the following description when taken in conjunction with the accompanying drawings, in which preferred embodiments of the present invention are shown by way of illustrative example.

BRIEF DESCRIPTION OF DRAWINGS

FIGS. 7A and 7B are a schematic configuration diagram and a plan view, respectively, of an actuator control device according to a third exemplary embodiment;

FIG. 8 is a schematic configuration diagram of an actuator control device according to a fourth exemplary embodiment;

DESCRIPTION OF EMBODIMENTS

Preferred embodiments of an actuator control device according to the present invention will be described in detail below with reference to the accompanying drawings.

1. Schematic Configuration of Actuator Control Device 10

Figure 1:
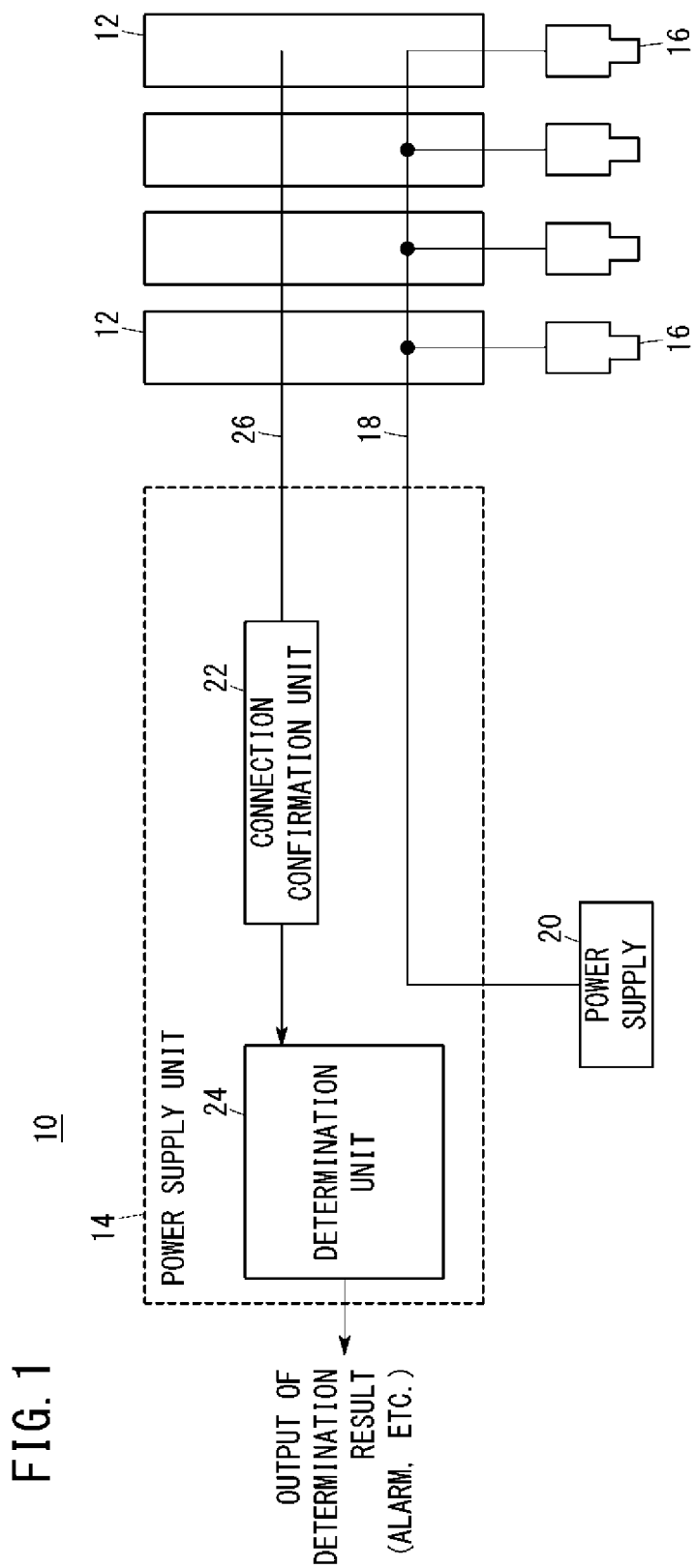
FIG. 1 is a schematic configuration diagram of an actuator control device according to an embodiment of the present invention.

As shown in FIG. 1, the actuator control device 10 according to the present embodiment includes a plurality of controller units 12 and a power supply unit 14.

The plurality of controller units 12 are consecutively disposed and connected in one direction (the left-right direction of the sheet in FIG. 1) with respect to the power supply unit 14. Stated otherwise, the plurality of controller units 12 are connected in series (in a row) with respect to the power supply unit 14. The power supply unit 14 is connected to a controller unit 12 on an upstream side (the left side in FIG. 1) of the plurality of controller units 12 in the connecting direction. An actuator 16 is connected to each one of the plurality of controller units 12.

The power supply unit 14 and the plurality of controller units 12 are connected via a power supply line 18. The power supply unit 14 supplies electrical power from an external power supply 20 to the plurality of controller units 12 via the power supply line 18. Each of the plurality of controller units 12 controls an actuator 16 by controlling the supply of electrical power to the actuator 16, in the case that electrical power is supplied via the power supply line 18. Accordingly, the power supply unit 14 centrally manages the supply of electrical power with respect to the plurality of controller units 12 and the plurality of actuators 16.

Further, a connection confirmation unit 22 and a determination unit 24 are provided in the power supply unit 14. The connection confirmation unit 22 and the plurality of controller units 12 are connected via a signal line 26. Via the signal line 26, the connection confirmation unit 22 confirms the connection state of the plurality of controller units 12 with respect to the power supply unit 14, and outputs the confirmation result to the determination unit 24. On the basis of the confirmation result from the connection confirmation unit 22, the determination unit 24 determines whether or not the current connection state is a connection state in which supply of electrical power is allowable, and outputs such a determination result to the exterior.

Moreover, in the configuration of FIG. 1, the connection confirmation unit 22 and the determination unit 24 are configured by an analog circuit or a microcomputer, or the like. Further, the connection confirmation unit 22 and the determination unit 24 may be disposed externally of the power supply unit 14. Furthermore, in the configuration of FIG. 1, it is sufficient insofar as at least the plurality of controller units 12, the plurality of actuators 16, the power supply line 18, the connection confirmation unit 22, the determination unit 24, and the signal line 26 are provided. Accordingly, it is also possible to omit the power supply unit 14, and to directly supply the electrical power from the power supply 20 to the plurality of controller units 12 via the power supply line 18.

2. Operations of the Actuator Control Device 10 of FIG. 1

Next, operations of the actuator control device 10 according to the present embodiment will be described with reference to the flowchart of FIG. 2. In this instance, the operations of the connection confirmation unit 22 and the determination unit 24 will primarily be described for a case in which the connection confirmation unit 22 and the determination unit 24 are constituted by a microcomputer. In the present description, the operations of the connection confirmation unit 22 and the determination unit 24 are performed at a time that the power supply unit 14 is powered on, or at a time of reset.

It should be noted that the phrase "at a time that the power supply is powered on" refers to a time of starting the supply of electrical power from the power supply unit 14 to the plurality of controller units 12 via the power supply line 18, for the purpose of controlling the plurality of actuators 16. Further, the phrase "at a time of reset" refers to a time of maintenance of the actuator control device 10 or a time that an initial adjustment is made to the actuator control device 10, for example, a case in which supply of electrical power is carried out from the power supply unit 14 to the plurality of controller units 12 via the power supply line 18, after a controller unit 12 is newly added, or after the number of controller units 12 connected to the power supply unit 14 is reduced.

First, in step S1, when the user turns on a non-illustrated switch provided on the power supply unit 14, the power supply unit 14 starts supplying electrical power from the external power supply 20 to the plurality of controller units 12 via the power supply line 18.

In step S2, the connection confirmation unit 22 transmits to the plurality of controller units 12 via the signal line 26 request signals for inquiring of the plurality of controller units 12, for example, the two points of (1) whether the controller units 12 are connected to the power supply unit 14, and (2) whether the actuators 16 are connected thereto. In the case that the request signals are received, the plurality of controller units 12 confirm the connection with the actuators 16, and transmit to the connection confirmation unit 22 via the signal line 26, response signals for giving to the connection confirmation unit 22 replies concerning the two points of (1) the connection to the power supply unit 14 and (2) the presence or absence of the connection of the actuators 16.

By confirming each of the received response signals, the connection confirmation unit 22 confirms the number of the plurality of controller units 12 connected to the power supply unit 14, and the number of actuators 16 connected to the controller units 12. More specifically, the connection confirmation unit 22 can confirm the number of the controller units 12 that are connected to the power supply unit 14 by grasping the number of the controller units 12 that have transmitted response signals. Further, the connection confirmation unit 22 can confirm the number of the actuators 16 by grasping the presence or absence of connections of the actuators 16 included within the response signals.

Further, the connection confirmation unit 22 determines an expected total power consumption, which is the sum of the power consumptions that are expected from the plurality of controller units 12 and the plurality of actuators 16, in accordance with the number of the controller units 12 connected to the power supply unit 14, and the number of the actuators 16 connected to the controller units 12 (hereinafter referred to as the number of connected devices).

For example, in the case that the plurality of controller units 12 are controller units 12 having the same specification, and the plurality of actuators 16 are actuators 16 having the same specification, the expected total power consumption is given by (the expected power consumption per one of the controller units 12)×(the number of the controller units 12)+(the expected power consumption per one of the actuators 16)×(the number of the actuators 16)=(the expected total power consumption).

Moreover, in the case that the plurality of controller units 12 are controller units 12 having different specifications, or when the plurality of actuators 16 are actuators 16 having different specifications, the expected total power consumption may be determined by summing the expected power consumptions of the controller units 12 and the actuators 16.

In addition, the connection confirmation unit 22 outputs as connection information to the determination unit 24 the connection state of the plurality of controller units 12, that is, the number of connected devices of the plurality of controller units 12 and the plurality of actuators 16, or alternatively, the expected total power consumption that was determined.

In step S3, based on the connection information that was input thereto, the determination unit 24 determines whether or not the current connection state is a connection state in which supply of electrical power from the power supply unit 14 to the plurality of controller units 12 is allowable (whether or not it lies within a permissible value).

More specifically, in the case that the connection information input to the determination unit 24 is the number of connected devices of the plurality of controller units 12 and the plurality of actuators 16, the determination unit 24 determines whether or not the number of connected devices is less than or equal to a maximum allowable number, which is a number corresponding to the maximum amount of electrical power (maximum allowable power) that can be supplied from the power supply unit 14 via the power supply line 18. Further, in the case that the connection information input to the determination unit 24 is the expected total power consumption, the determination unit 24 determines whether or not the expected total power consumption is less than or equal to the maximum allowable power. These allowable values may be stored in advance, for example, in a non-illustrated memory, and may be read out from the memory and used in the determination process at a time that the determination process is performed.

In step S3, if the number of connected devices is less than or equal to the maximum allowable number, or alternatively, if the expected total power consumption is less than or equal to the maximum allowable power (step S3: YES), the process proceeds to the following step S4. In step S4, the determination unit 24 determines that electrical power can be normally supplied from the power supply unit 14 to the plurality of controller units 12 via the power supply line 18, and outputs the determination result to the exterior. In this case, as methods of outputting the determination result to the exterior, there may be cited, for example, (1) illumination of a non-illustrated indication lamp provided on the power supply unit 14, (2) a sound output (alarm) from a speaker (not shown), or (3) outputting of the determination result to an upper level device of the actuator control device 10 such as a PLC (Programmable Logic Controller) or the like.

On the other hand, in step S3, if the number of connected devices exceeds the maximum allowable number, or alternatively, if the expected total power consumption exceeds the maximum allowable power (step S3: NO), the process proceeds to the following step S5. In step S5, the determination unit 24 determines that, if electrical power is supplied from the power supply unit 14 to the plurality of controller units 12 via the power supply line 18, an abnormal condition will occur in which the amount of electrical power is insufficient, and outputs such a determination result to the exterior. In this case as well, it is possible to output the abnormal determination result to the exterior using the same output method as in step S4. Alternatively, the determination unit 24 may stop the supply of electrical power to the plurality of controller units 12 via the power supply line 18, and may output to the exterior notifying content indicating that the supply of electrical power has been stopped.

Accordingly, in either case of step S4 or step S5, on the basis of the determination result output from the determination unit 24, the user is capable of easily grasping whether the current connection state is a normal state or an abnormal state. As a result, in the case of a determination result of a normal state, the user can take countermeasures such as adding controller units 12 or connecting actuators 16 to the controller units 12 to which actuators 16 are not yet connected, in a manner so as not to exceed the maximum permissible number or the maximum allowable power. Further, in the case of a determination result of an abnormal state, the user can take countermeasures such as reducing the number of controller units 12 or removing actuators 16 from the controller units 12, so as to be less than or equal to the maximum allowable number or so as to remain less than or equal to the maximum allowable power.

Moreover, in the case that the connection confirmation unit 22 and the determination unit 24 are configured by analog circuits, in step S2, the connection confirmation unit 22 energizes the signal line 26, and detects the value of the current flowing through the signal line 26, whereby the number of units of the plurality of controller units 12 and the plurality of actuators 16 may be confirmed. More specifically, the plurality of controller units 12 and the plurality of actuators 16 can be regarded as loads that are connected (in series) to the power supply unit 14. Therefore, the value of the current flowing through the signal line 26 is a current value corresponding to the number of connected devices of the plurality of controller units 12 and the plurality of actuators 16. The connection confirmation unit 22 outputs the detected current value as connection information to the determination unit 24.

In this case, the determination unit 24 may be constituted by a comparison circuit. Consequently, in step S3, the determination unit 24 can compare the input current value with a threshold (allowable value) corresponding to the maximum allowable number or the maximum allowable power. In this case, if the input current value is less than or equal to the threshold value (step S3: YES), then in step S4, an output result corresponding to a normal state is output to the exterior from the determination unit 24. Further, if the input current value exceeds the threshold value (step S3: NO), then in step S5, an output result corresponding to an abnormal state is output to the exterior from the determination unit 24.

Figure 2:
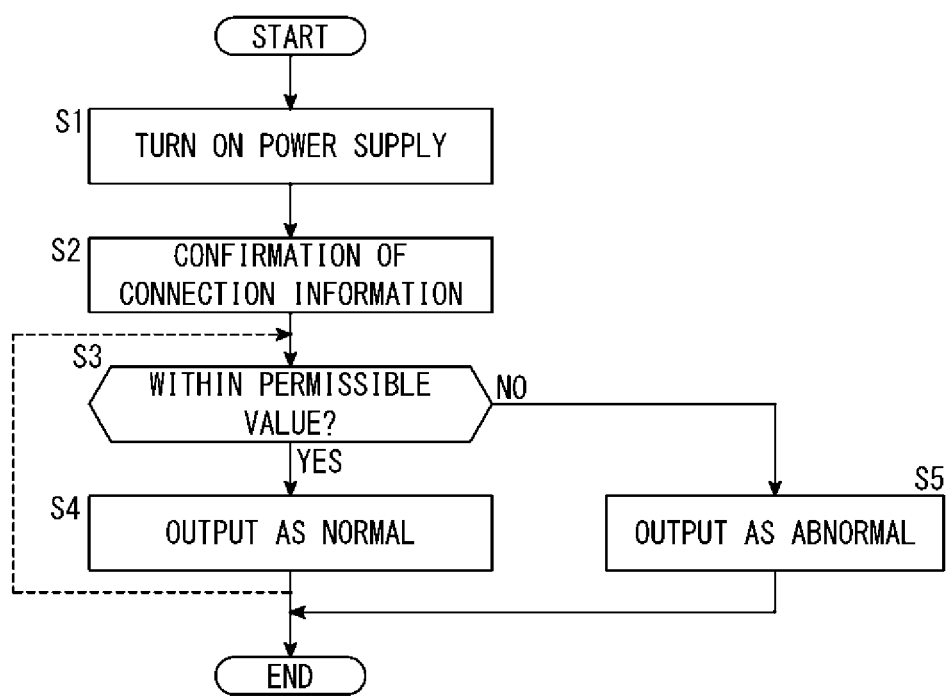
FIG. 2 is a flowchart showing operations of the actuator control device of FIG. 1.

Further, as shown by the dashed line in FIG. 2, the actuator control device 10 is capable of repeatedly carrying out the processes of steps S3 to S5.

3. Modification of the Actuator Control Device 10 of FIG. 1

Figure 3:
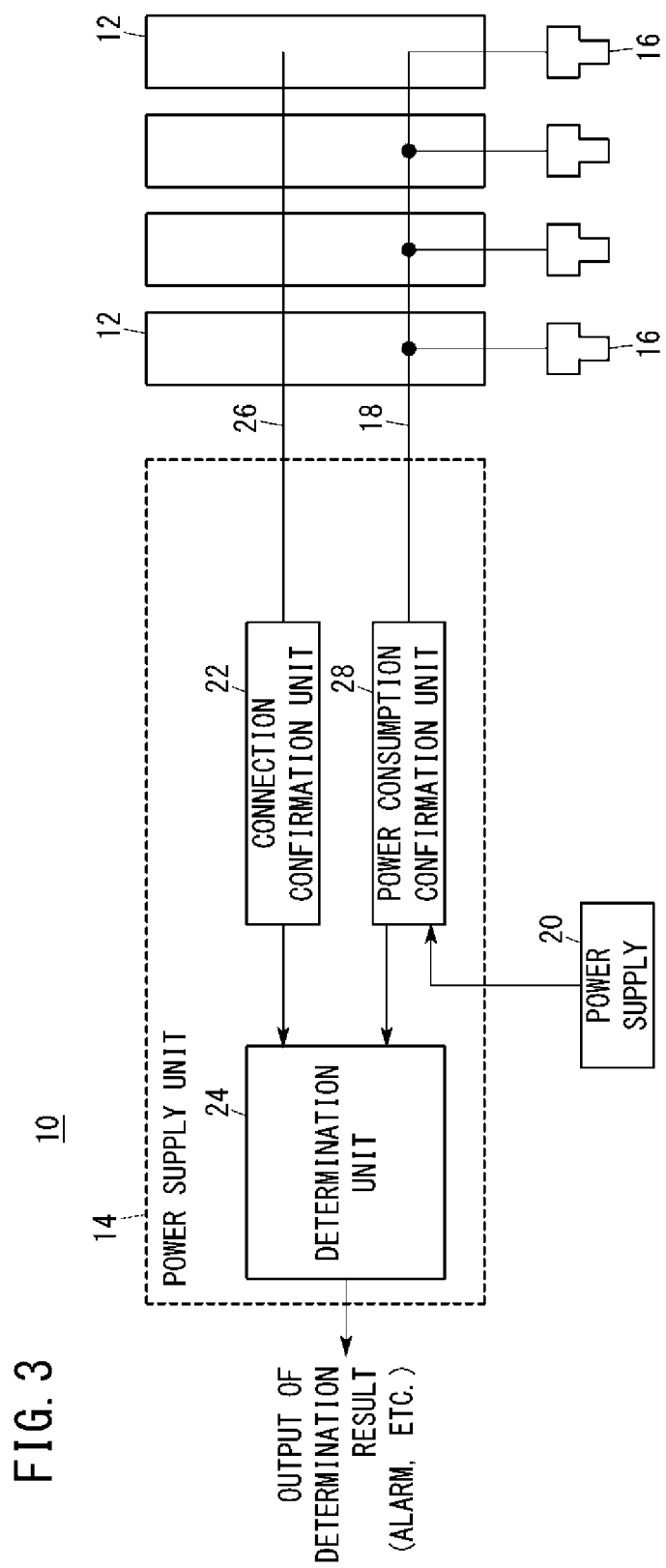
FIG. 3 is a schematic configuration diagram showing a modification of the actuator control device shown in FIG. 1.

The actuator control device 10 according to the present embodiment can be configured as shown in FIG. 3. In FIG. 3, a power consumption confirmation unit 28 is further provided in the power supply unit 14.

The power consumption confirmation unit 28 is connected via the power supply line 18 to the plurality of controller units 12. The power consumption confirmation unit 28 detects the electrical power supplied from the external power supply 20 to the plurality of controller units 12 via the power supply line 18, whereby a total actual power consumption, which is the sum of the actual power consumptions of the plurality of controller units 12 and the plurality of actuators 16, is confirmed. The power consumption confirmation unit 28 outputs the confirmation result thereof to the determination unit 24. Accordingly, on the basis of the confirmation result from the connection confirmation unit 22, and the confirmation result from the power consumption confirmation unit 28, the determination unit 24 determines whether or not the current connection state is a connection state in which supply of electrical power is allowable, and outputs such a determination result to the exterior. In this case as well, the power consumption confirmation unit 28 may be configured by an analog circuit or a microcomputer, or the like, and may be disposed externally of the power supply unit 14. Furthermore, in the configuration of FIG. 3, it is sufficient insofar as at least the plurality of controller units 12, the plurality of actuators 16, the power supply line 18, the connection confirmation unit 22, the determination unit 24, the signal line 26, and the power consumption confirmation unit 28 are provided. Accordingly, it is also possible to omit the power supply unit 14, and to supply the electrical power from the power supply 20 to the plurality of controller units 12 via the power consumption confirmation unit 28 and the power supply line 18.

4. Operations of the Actuator Control Device 10 of FIG. 3

Next, operations of the actuator control device 10 of FIG. 3 will be described with reference to the flowchart of FIG. 4.

In step S11, similar to step S1 of FIG. 2, the user turns on a switch of the power supply unit 14, and causes the power supply 20 to start supplying electrical power to the plurality of controller units 12 via the power supply line 18.

In step S12, similar to step S2, the connection confirmation unit 22 confirms the connection state of the plurality of controller units 12 and the plurality of actuators 16, and transmits the confirmation result (the number of connected devices or the expected total power consumption) as connection information to the determination unit 24.

In step S13, the maximum allowable power is input to the determination unit 24. In this case, the maximum allowable power may be input from an external upper level device, or may be set by the user operating a non-illustrated operation switch provided on the power supply unit 14.

In step S14, the power consumption confirmation unit 28 confirms the electrical power supplied to the plurality of controller units 12 via the power supply line 18, i.e., the total actual power consumption, and outputs the confirmation result of the total actual power consumption to the determination unit 24.

In step S15, on the basis of the connection information from the connection confirmation unit 22, and the total actual power consumption which is the confirmation result from the power consumption confirmation unit 28, the determination unit 24 determines whether or not the current connection state is a connection state capable of allowing supply of electrical power. More specifically, the determination unit 24 confirms the number of connected devices indicated by the connection information, and then determines whether or not the total actual power consumption is less than or equal to the maximum allowable power.

In step S15, if the total actual power consumption is less than or equal to the maximum allowable power (step S15: YES), the process proceeds to the following step S16. In step S16, similar to step S4, the determination unit 24 determines that electrical power can be normally supplied from the power supply unit 14 to the plurality of controller units 12 via the power supply line 18, and outputs the determination result to the exterior.

On the other hand, in step S15, if the total actual power consumption exceeds the maximum allowable power (step S15: NO), the process proceeds to the following step S17. In step S17, the determination unit 24 determines that, when electrical power is supplied from the power supply unit 14 to the plurality of controller units 12 via the power supply line 18, an abnormal condition will occur in which the amount of electrical power is insufficient, and outputs such a determination result to the exterior. In this case as well, it is possible to output the abnormal determination result to the exterior using the same output method as in step S5.

Accordingly, in either case of step S16 or step S17, on the basis of the determination result output from the determination unit 24, the user is capable of easily grasping whether the current connection state is a normal state or an abnormal state, and can take the same countermeasures as in steps S4 and S5.

Figure 4:
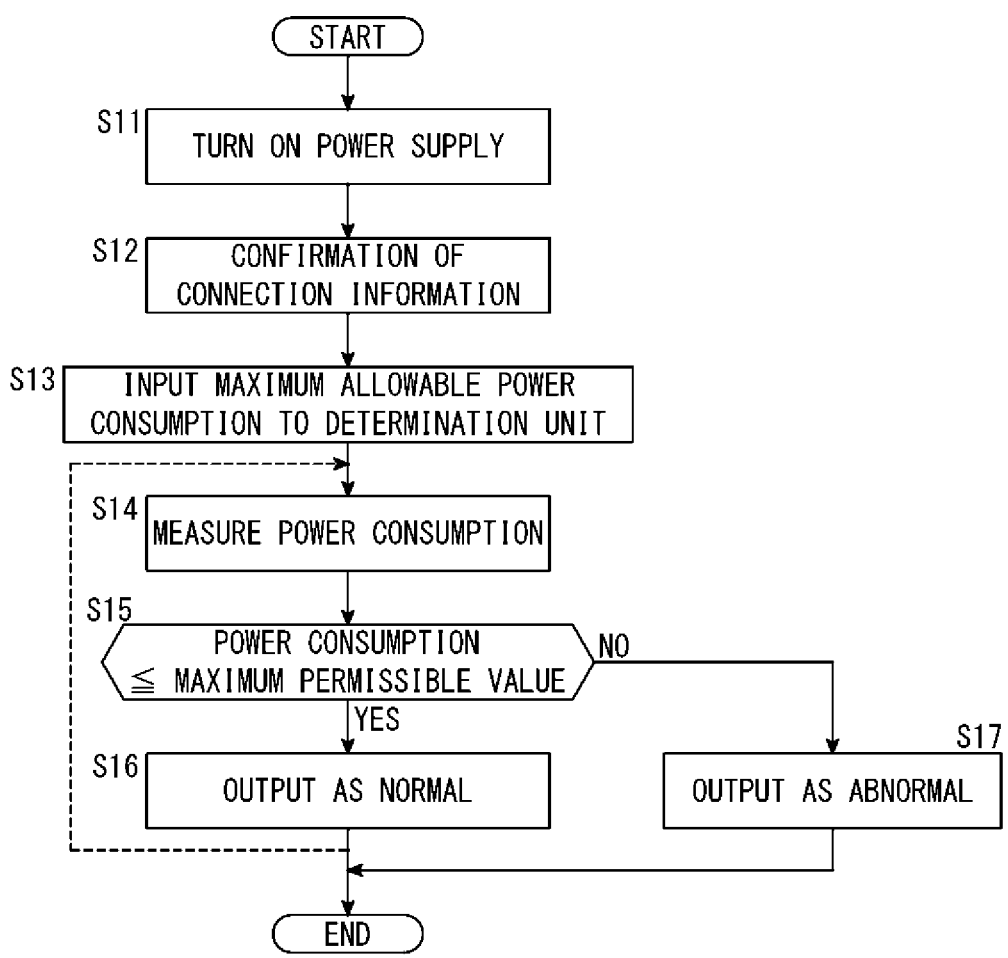
FIG. 4 is a flowchart showing operations of the actuator control device of FIG. 3.

Further, as shown by the dashed line in FIG. 4, the actuator control device 10 is capable of repeatedly carrying out the processes of steps S14 to S17.

5. Specific Examples of Actuator Control Device 10

Next, specific examples of the actuator control device 10 (actuator control devices 10A to 10G according to first through seventh exemplary embodiments) will be described with reference to FIGS. 5A to 11. In the first to seventh exemplary embodiments, the same reference numerals are used to denote the same constituent elements as those in FIGS. 1 and 3, and detailed description of such features may be omitted.

5.1. First Exemplary Embodiment

Figure 5A:
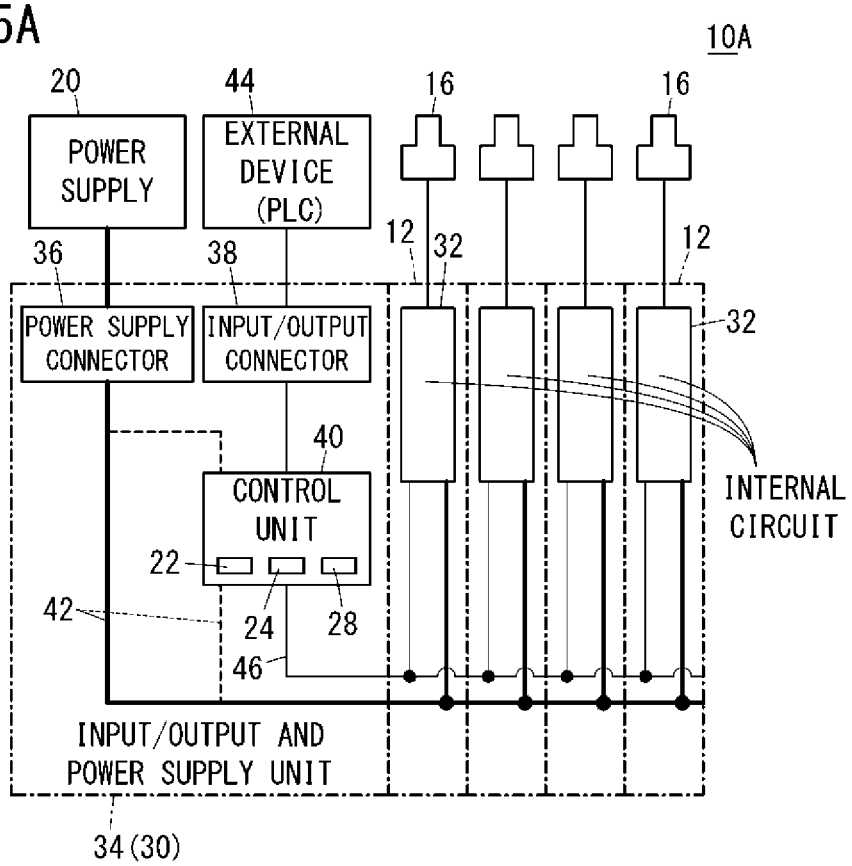
FIGS. 5A and 5B are a schematic configuration diagram and a plan view, respectively, of an actuator control device according to a first exemplary embodiment.

FIG. 5A is a schematic configuration diagram of an actuator control device 10A according to a first exemplary embodiment. The actuator control device 10A according to the first exemplary embodiment includes a plurality of controller units 12 and an input/output and power supply unit 30. Similar to the actuator control device 10 of FIGS. 1 and 3, in the actuator control device 10A, a plurality of controller units 12 are consecutively disposed and connected in one direction (connecting direction). Each of the plurality of controller units 12 includes an internal circuit 32 connected to the actuator 16 and which controls the actuator 16.

The input/output and power supply unit 30 is an upper level unit 34, which is connected to a controller unit 12 on an upstream side (the left side in FIG. 5A) of the plurality of controller units 12 in the connecting direction. The input/output and power supply unit 30 includes a power supply connector 36, an input/output connector 38, and a control unit 40, and as will be described later, is equipped dually with the function of the power supply unit 14 (see FIGS. 1 and 3) to carry out supply of electrical power to the plurality of controller units 12, and the function of an input/output unit to perform input and output of signals to and from the plurality of controller units 12.

The power supply connector 36 is connected to an external power supply 20. A power supply line 42 extends from the power supply connector 36, and is connected to the internal circuits 32 of the plurality of controller units 12. The input/output connector 38 is connected to an external device 44 such as a PLC or the like. A signal line 46 extends from the input/output connector 38, and is connected to the internal circuits 32 of the plurality of controller units 12.

The control unit 40 is disposed at a midway position in the signal line 46, and performs transmission and reception (input and output) of signals to and from the external device 44 via the input/output connector 38 and the signal line 46, while on the other hand, performs transmission and reception of signals to and from the internal circuits 32 of the plurality of controller units 12 via the signal line 46. Further, the control unit 40 is constituted to include the connection confirmation unit 22, the determination unit 24, and the power consumption confirmation unit 28 shown in FIGS. 1 and 3. In this case, the control unit 40 may include at least the connection confirmation unit 22 and the determination unit 24. Accordingly, in the case that the control unit 40 does not include the power consumption confirmation unit 28, as indicated by the bold line in FIG. 5A, the power supply line 42 is connected to the plurality of internal circuits 32 without going through the control unit 40. On the other hand, in the case that the control unit 40 includes the power consumption confirmation unit 28, as indicated by the dashed line and the bold line in FIG. 5A, the power supply line 42 is connected to the plurality of internal circuits 32 via the control unit 40.

In this instance, in the case that supply of electrical power is being carried out from the power supply 20 to each of the internal circuits 32 via the power supply connector 36 and the power supply line 42, when instruction signals instructing that the actuators 16 be driven are supplied from the external device 44 to the control unit 40 via the input/output connector 38 and the signal line 46, then on the basis of the supplied instruction signals, the control unit 40 supplies control signals in order to instruct driving of the actuators 16 to the internal circuits 32 of the plurality of controller units 12 via the signal line 46. Based on the input control signals, the internal circuits 32 control the respective actuators 16 by controlling the supply of electrical power with respect to the actuators 16. Further, the internal circuits 32 output the states of the respective actuators 16, for example, detection results of non-illustrated sensors provided in the actuators 16, to the control unit 40 via the signal line 46. The control unit 40 outputs the states of the actuators 16 (the detection results of the sensors) that were input thereto to the external device 44 via the input/output connector 38.

In this case, at a time of powering on or at a time of resetting the input/output and power supply unit 30, among the respective internal circuits 32 and via the signal line 46, the connection confirmation unit 22 of the control unit 40 confirms the connection state of the plurality of controller units 12 and the plurality of actuators 16 with respect to the input/output and power supply unit 30. Further, at a time of powering on or at a time of resetting the input/output and power supply unit 30, the power consumption confirmation unit 28 of the control unit 40 confirms the total actual power consumption of the plurality of controller units 12 and the plurality of actuators 16.

Further, on the basis of the confirmation result of the connection confirmation unit 22, or the confirmation results of the connection confirmation unit 22 and the power consumption confirmation unit 28, the determination unit 24 of the control unit 40 determines whether or not the current connection state is a connection state capable of allowing supply of electrical power from the input/output and power supply unit 30 to the plurality of controller units 12. The determination result of the determination unit 24 is output to the external device 44, for example, via the signal line 46 and the input/output connector 38.

Figure 5B:
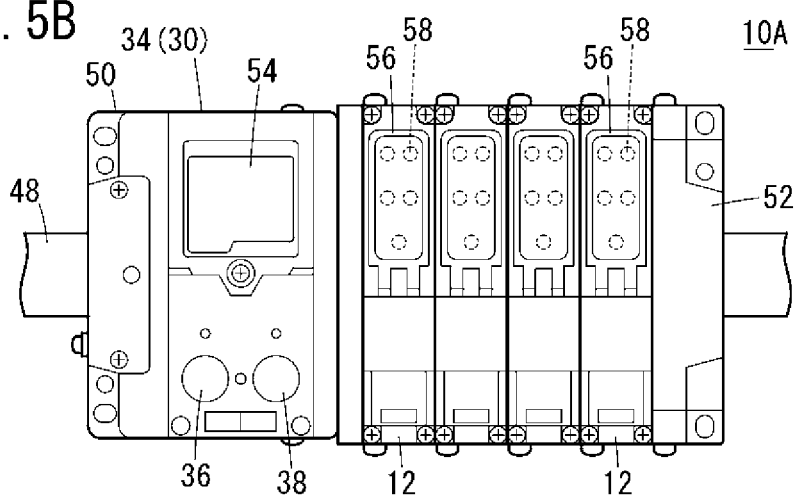

A plan view of the external structure of the actuator control device 10A, in which the schematic configuration of FIG. 5A is realized, is shown in FIG. 5B. As shown in FIG. 5B, in the actuator control device 10A, a plurality of substantially rectangular controller units 12, and a substantially rectangular input/output and power supply unit 30 are mounted on a rail 48 that extends in left and right directions, and thereby are consecutively disposed and connected in the direction (connecting direction) in which the rail 48 extends. On the left side of the input/output and power supply unit 30, one end plate 50 is consecutively disposed and attached to the rail 48. Further, among the plurality of controller units 12, on the right side of the controller unit 12 on the downstream side, another end plate 52 is consecutively disposed and attached to the rail 48.

On an upper surface of the input/output and power supply unit 30, the power supply connector 36, the input/output connector 38, and a display unit 54 for displaying determination results and the like are arranged. Further, lid members 56 which can be opened and closed by operations of the user are provided on upper surfaces of the plurality of controller units 12. The lid members 56 cover from above operation switches 58 that are capable of being operated by the user. Accordingly, by the user operating the operation switches 58 in a state with the lid members 56 opened, various instructions can be imparted, or desired parameters can be set with respect to the internal circuits 32. Further, the plurality of controller units 12 are connected to the actuators 16, for example, via non-illustrated cables from side surfaces thereof that are exposed to the exterior.

5.2. Second Exemplary Embodiment

Figure 6A:
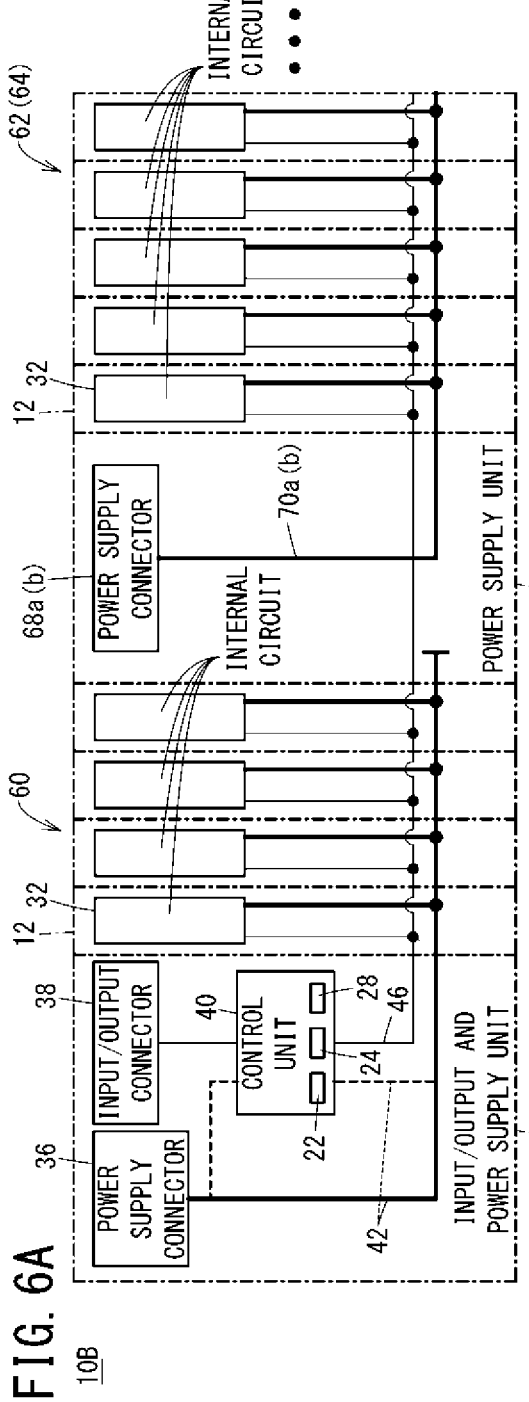
FIGS. 6A and 6B are a schematic configuration diagram and a plan view, respectively, of an actuator control device according to a second exemplary embodiment.
Figure 6B:
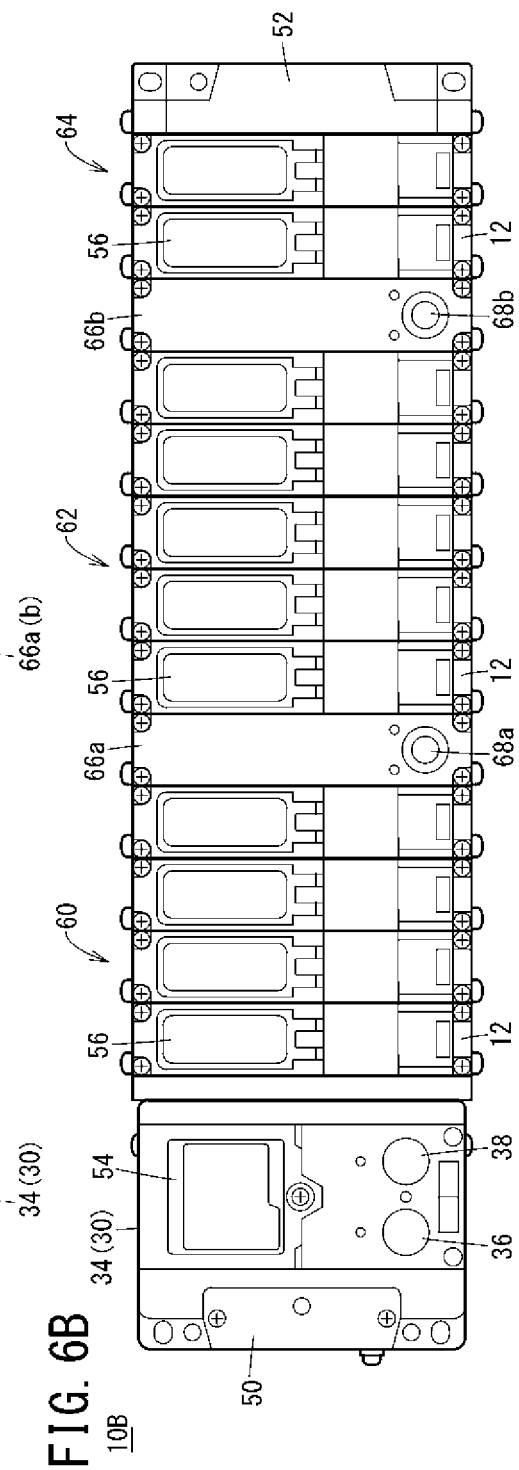

FIGS. 6A and 6B are a schematic configuration diagram and a plan view of the external structure, respectively, of an actuator control device 10B according to a second exemplary embodiment. The actuator control device 10B according to the second exemplary embodiment differs from the actuator control device 10A according to the first exemplary embodiment (see FIGS. 5A and 5B), in that power supply units 66a, 66b having the same configuration as the power supply unit 14 (see FIGS. 1 and 3) are interposed between each of an arbitrary number of units of the plurality of controller units 12. In this case, the arbitrary number of the controller units 12 constitutes each one of the blocks 60 to 64.

In the example shown in FIGS. 6A and 6B, the plurality of controller units 12 are constituted from three blocks 60, 62, 64. More specifically, a first (upstream) block 60 is constituted by four controller units 12 between the input/output and power supply unit 30, which is the upper level unit 34, and the power supply unit 66a, which is interposed first along the connecting direction. Further, a second (midstream) block 62 is constituted by five controller units 12 between the power supply unit 66a on the upstream side and a power supply unit 66b on the downstream side thereof. Furthermore, a third (downstream) block 64 is constituted by two controller units 12 between the downstream side power supply unit 66b and a downstream side end plate 52.

In addition, in the actuator control device 10B of the second exemplary embodiment, the control unit 40 is connected via the signal line 46 to the internal circuits 32 of all of the controller units 12. Stated otherwise, the signal line 46 extends along the connecting direction inside the first block 60, the upstream side power supply unit 66a, the second block 62, the downstream side power supply unit 66b, and the third block 64.

Further, in the configurations of FIGS. 1, 3, 5A and 5B, electrical power is supplied to all of the controller units 12, from the power supply unit 14 or the input/output and power supply unit 30, which is the upper level unit 34. In contrast thereto, in the actuator control device 10B of the second exemplary embodiment, as shown in FIG. 6A, electrical power is supplied from the input/output and power supply unit 30 or the power supply units 66a, 66b, which is connected to the upstream side controller unit 12 of each of the blocks 60 to 64.

More specifically, the input/output and power supply unit 30 of the upper level unit 34 carries out supply of electrical power with respect to the internal circuits 32 of the four controller units 12 of the first block 60. In greater detail, the power supply line 42, which extends from the power supply connector 36 of the input/output and power supply unit 30, extends into the four controller units 12 of the first block 60 that is connected on the downstream side of the input/output and power supply unit 30, and is connected to each of the internal circuits 32 thereof. Accordingly, the power supply line 42 does not extend up to the downstream side power supply unit 66b or the blocks 62, 64.

Further, the upstream side power supply unit 66a carries out supply of electrical power with respect to the internal circuits 32 of the five controller units 12 of the second block 62. In greater detail, the power supply unit 66a includes a power supply connector 68a capable of being connected to the power supply 20, and a power supply line 70a that extends from the power supply connector 68a. The power supply line 70a extends into the five controller units 12 of the second block 62 that is connected on the downstream side of the power supply unit 66a, and is connected to each of the internal circuits 32 thereof. Accordingly, the power supply line 70a does not extend up to the downstream side power supply unit 66b or the block 64.

Furthermore, the downstream side power supply unit 66b carries out supply of electrical power with respect to the internal circuits 32 of the two controller units 12 of the third block 64. In greater detail, the power supply unit 66b includes a power supply connector 68b capable of being connected to the power supply 20, and a power supply line 70b that extends from the power supply connector 68b. The power supply line 70b extends into the two controller units 12 of the third block 64 that is connected on the downstream side of the power supply unit 66b, and is connected to each of the internal circuits 32 thereof.

In this manner, according to the second exemplary embodiment, power can be supplied with respect to the controller units 12 in each of the blocks 60 to 64. Moreover, as shown in FIG. 6B, the power supply units 66a, 66b on the upstream side and the downstream side are attached to the rail 48 (see FIG. 5B) in a state of being sandwiched between the controller units 12 on both sides thereof in the connecting direction. Further, the power supply connectors 68a, 68b are arranged respectively on upper surfaces of the power supply units 66a, 66b.

In addition, according to the second exemplary embodiment, in the case that supply of electrical power is being carried out to the internal circuits 32 in each of the blocks 60 to 64, when instruction signals are supplied from the external device 44 to the control unit 40 via the input/output connector 38 and the signal line 46, then on the basis of the supplied instruction signals, the control unit 40 of the input/output and power supply unit 30 supplies control signals to each of the internal circuits 32 via the signal line 46. In this case, only the internal circuits 32 of the blocks 60 to 64 that have received the supply of electrical power thereto, on the basis of the input control signals, control the supply of electrical power with respect to the actuators 16, and thereby control the actuators 16.

Further, in the second exemplary embodiment as well, in the same manner as the first exemplary embodiment, the connection confirmation unit 22 and the determination unit 24, or the connection confirmation unit 22, the power consumption confirmation unit 28, and the determination unit 24 carry out predetermined processes, whereby determination results are output from the determination unit 24 to the external device 44, or the determination results are displayed on the display unit 54.

5.3. Third Exemplary Embodiment

FIGS. 7A and 7B are a schematic configuration diagram and a plan view of the external structure, respectively, of an actuator control device 10C according to a third exemplary embodiment. The actuator control device 10C according to the third exemplary embodiment differs from the actuator control device 10B according to the second exemplary embodiment (see FIGS. 6A and 6B), in that, concerning the plurality of controller units 12, input/output and power supply units 30a to 30c are interposed between every four units thereof, the upper level unit 34 is formed by an input/output unit 71, and the input/output and power supply unit 30a is interposed between the input/output unit 71 and the first block 60.

The input/output unit 71 is equipped with the same configuration as that of the input/output and power supply units 30, 30a to 30c, however, is formed as a unit that does not carry out supply of electrical power to the controller units 12. Alternatively, the input/output unit 71 may be formed as a unit having only the input/output connector 38, the control unit 40, and the signal line 46. In addition, regarding the input/output and power supply units 30a to 30c that are interposed, the same constituent elements as those of the input/output and power supply unit 30 will be described using the same reference numerals, with the subscripts "a to c" appended thereto.

In the third exemplary embodiment, the input/output unit 71 of the upper level unit 34 is connected via the signal line 46 to the internal circuits 32 of all of the controller units 12. Stated otherwise, the signal line 46 extends along the connecting direction inside the first (upstream side) input/output and power supply unit 30a, the first block 60, the second (midstream side) input/output and power supply unit 30b, the second block 62, the third (downstream side) input/output and power supply unit 30c, and the third block 64.

Further, in the third exemplary embodiment, the controller units 12 of each of the blocks 60 to 64 receive electrical power supplied from the corresponding one of the input/output and power supply units 30a to 30c, which is directly connected to the upstream side controller unit 12 of each of the blocks 60 to 64. In this case, each of the input/output and power supply units 30a to 30c is configured so as to be capable of inputting and outputting signals to and from the four controller units 12 of each of the blocks 60 to 64 that are connected thereto.

More specifically, as shown in FIG. 7B, the same number of input/output connectors 38a to 38c as the four controller units 12 that constitute one of the connected blocks 60 to 64, and one power supply connector 36a to 36c are arranged on the upper surface of each of the input/output and power supply units 30a to 30c. Each of the four input/output connectors 38a to 38c is connected via the signal line 46a to 46c to the internal circuit 32 of its corresponding controller unit 12. In this case, a control unit 40a to 40c is disposed at midway positions of the four signal lines 46a to 46c. Further, the power supply connector 36a to 36c is connected via the power supply line 42a to 42c to the internal circuits 32 of the controller units 12 in the corresponding block.

Accordingly, in the third exemplary embodiment, each of the internal circuits 32 is capable of transmitting and receiving signals to and from the input/output unit 71, while on the other hand, is also capable of transmitting and receiving signals to and from the corresponding one of the input/output and power supply units 30a to 30c. It should be noted that, in FIG. 7A, in order to simplify illustration, only one of the input/output connectors 38a to 38c is shown for each of the input/output and power supply units 30a to 30c.

In addition, according to the third exemplary embodiment, in the case that supply of electrical power is being carried out, from the power supply 20 (see FIG. 5A) and via the power supply connector 36a to 36c and the power supply line 42a to 42c, to the internal circuits 32 in each of the blocks 60 to 64, when instruction signals are supplied from the external device 44 to the control unit 40 via the input/output connector 38 and the signal line 46 of the input/output unit 71, then on the basis of the supplied instruction signals, the control unit 40 of the input/output unit 71 supplies control signals to each of the internal circuits 32 via the signal line 46. In this case, only the internal circuits 32 of the blocks 60 to 64 that have received the supply of electrical power thereto, on the basis of the input control signals, control the supply of electrical power with respect to the actuators 16, and thereby control the actuators 16.

Further, in the third exemplary embodiment, instead of supplying control signals from the aforementioned input/output unit 71 to each of the internal circuits 32 via the signal line 46, concerning the specified blocks 60 to 64, in the case that supply of electrical power is carried out to the internal circuits 32 of the controller units 12 that constitute the blocks 60 to 64, it is possible to supply instruction signals from the external device 44 to the control units 40a to 40c via the input/output connectors 38a to 38c and the signal lines 46a to 46c of the input/output and power supply units 30a to 30c.

In this case, the control units 40a to 40c of the input/output and power supply units 30a to 30c supply the control signals based on the supplied instruction signals to the corresponding internal circuits 32 via the signal lines 46a to 46c. In this case, on the basis of the control signals input thereto, the internal circuits 32 control the supply of electrical power with respect to the actuators 16, and thereby control the actuators 16. More specifically, according to the third exemplary embodiment, separately from the input/output unit 71 of the upper level unit 34, the external device 44 and the individual input/output connectors 38a to 38c are connected, and by supplying the instruction signals, only certain specified actuators 16 can be operated independently and preferentially.

Furthermore, according to the third exemplary embodiment, since the input/output and power supply units 30a to 30c are each connected with respect to one of the blocks 60 to 64, in each of the blocks 60 to 64, it is possible for the connection confirmation unit 22 and the determination unit 24, or alternatively, the connection confirmation unit 22, the power consumption confirmation unit 28, and the determination unit 24 to carry out predetermined processes, and determination results from the determination unit 24 can be output to the external device 44. Alternatively, in the third exemplary embodiment as well, in the same manner as the first exemplary embodiment and the second exemplary embodiment, the connection confirmation unit 22 and the determination unit 24, or the connection confirmation unit 22, the power consumption confirmation unit 28, and the determination unit 24 on the side of the input/output unit 71 can carry out predetermined processes, and determination results can be output from the determination unit 24 to the external device 44, or the determination results can be displayed on the display unit 54. Accordingly, in the third exemplary embodiment, in addition to monitoring the entire power consumption of the actuator control device 10C, it is also possible to monitor the power consumption in each of the blocks 60 to 64.

5.4. Fourth Exemplary Embodiment

FIG. 8 is a schematic configuration diagram of an actuator control device 10D according to a fourth exemplary embodiment. The actuator control device 10D according to the fourth exemplary embodiment differs from the actuator control device 10C according to the third exemplary embodiment (see FIGS. 7A and 7B), in that the unit that is interposed between the input/output unit 71 of the upper level unit 34 and the first block 60 is the power supply unit 66. More specifically, the power supply unit 66 can be regarded as a unit in which the signal input/output function is excluded from the input/output and power supply unit 30a on the upstream side of the actuator control device 10C according to the third exemplary embodiment. Accordingly, the power supply unit 66 includes a power supply connector 68 corresponding to the power supply connector 36a, and a power supply line 70 corresponding to the power supply line 42a.

According to the fourth exemplary embodiment as well, it is possible to control the actuators 16 in each of the blocks 60 to 64, or in relation to all of the controller units 12. Further, in each of the blocks 60 to 64, or with respect to all of the controller units 12, the connection confirmation unit 22 and the determination unit 24, or the connection confirmation unit 22, the power consumption confirmation unit 28, and the determination unit 24 carry out predetermined processes, whereby determination results are output from the determination unit 24 to the external device 44, or the determination results are displayed on the display unit 54.

5.5. Fifth Exemplary Embodiment

Figure 9:
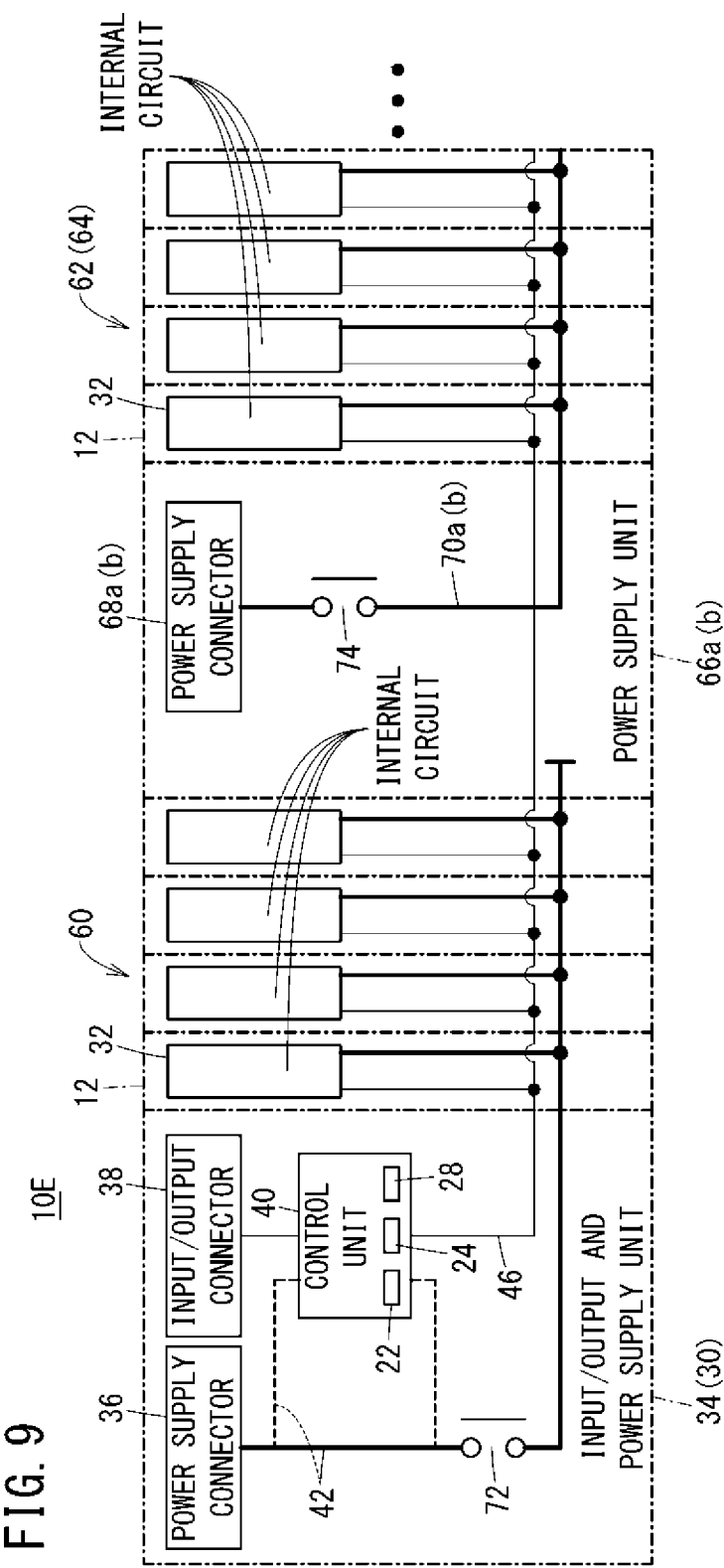
FIG. 9 is a schematic configuration diagram of an actuator control device according to a fifth exemplary embodiment.

FIG. 9 is a schematic configuration diagram of an actuator control device 10E according to a fifth exemplary embodiment. The actuator control device 10E according to the fifth exemplary embodiment differs from the actuator control device 10B according to the second exemplary embodiment (see FIGS. 6A and 6B), in that switches (switching units) 72, 74 are respectively connected to the power supply lines 42, 70a, 70b inside the input/output and power supply unit 30 of the upper level unit 34, and the power supply units 66a, 66b.

The switches 72, 74 are turned on or off in accordance with a control from the external device 44 or the control unit 40, or alternatively, by operation of non-illustrated operation switches made by the user. In this case, when the switches 72, 74 are turned on, electrical power is supplied via the power supply lines 42, 70a, 70b to the internal circuits 32 of the connected blocks 60 to 64. On the other hand, when the switches 72, 74 are turned off, the supply of electrical power to the respective internal circuits 32 via the power supply lines 42, 70a, 70b is terminated.

5.6. Sixth Exemplary Embodiment

Figure 10:
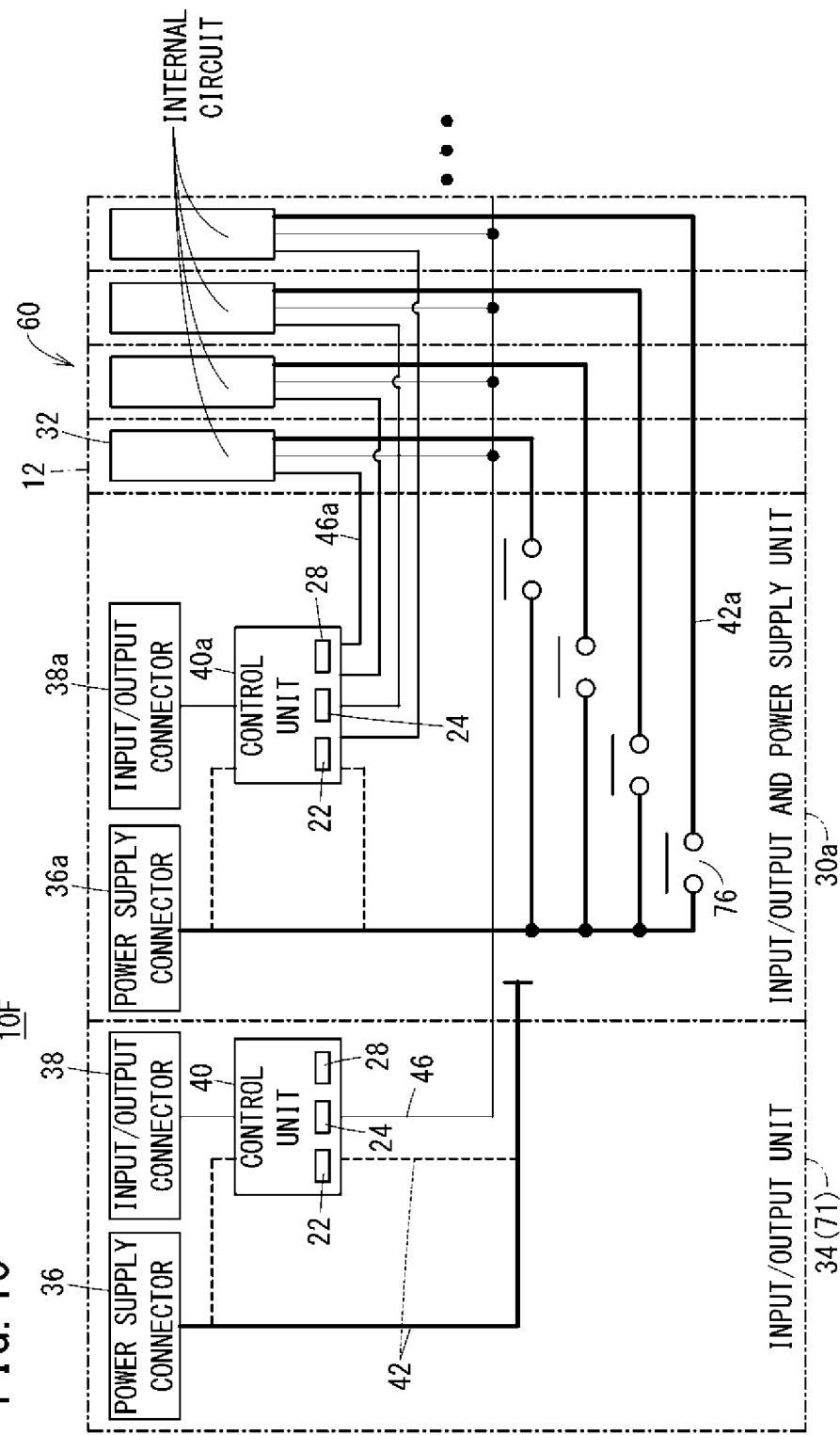
FIG. 10 is a schematic configuration diagram of an actuator control device according to a sixth exemplary embodiment.

FIG. 10 is a schematic configuration diagram of an actuator control device 10F according to a sixth exemplary embodiment. The actuator control device 10F according to the sixth exemplary embodiment differs from the actuator control device 10C according to the third exemplary embodiment (see FIGS. 7A and 7B), in that switches (switching units) 76 are provided in power supply lines 42a inside the input/output and power supply unit 30a. In this case, the power supply connector 36a is respectively connected via four power supply lines 42a to the internal circuits 32 of the four controller units 12 that constitute the block 60. The switches 76 are provided respectively in the four power supply lines 42a.

In the sixth exemplary embodiment as well, the respective switches 76 are turned on or off in accordance with a control from the external device 44 or the control unit 40a, or alternatively, by operation of non-illustrated operation switches made by the user. More specifically, when arbitrary ones of the switches 76 are turned on, electrical power is supplied to the internal circuits 32 connected to the power supply lines 42a. On the other hand, when arbitrary ones of the switches 76 are turned off, the supply of electrical power to the internal circuits 32 connected to the power supply lines 42a is terminated.

5.7. Seventh Exemplary Embodiment

Figure 11:
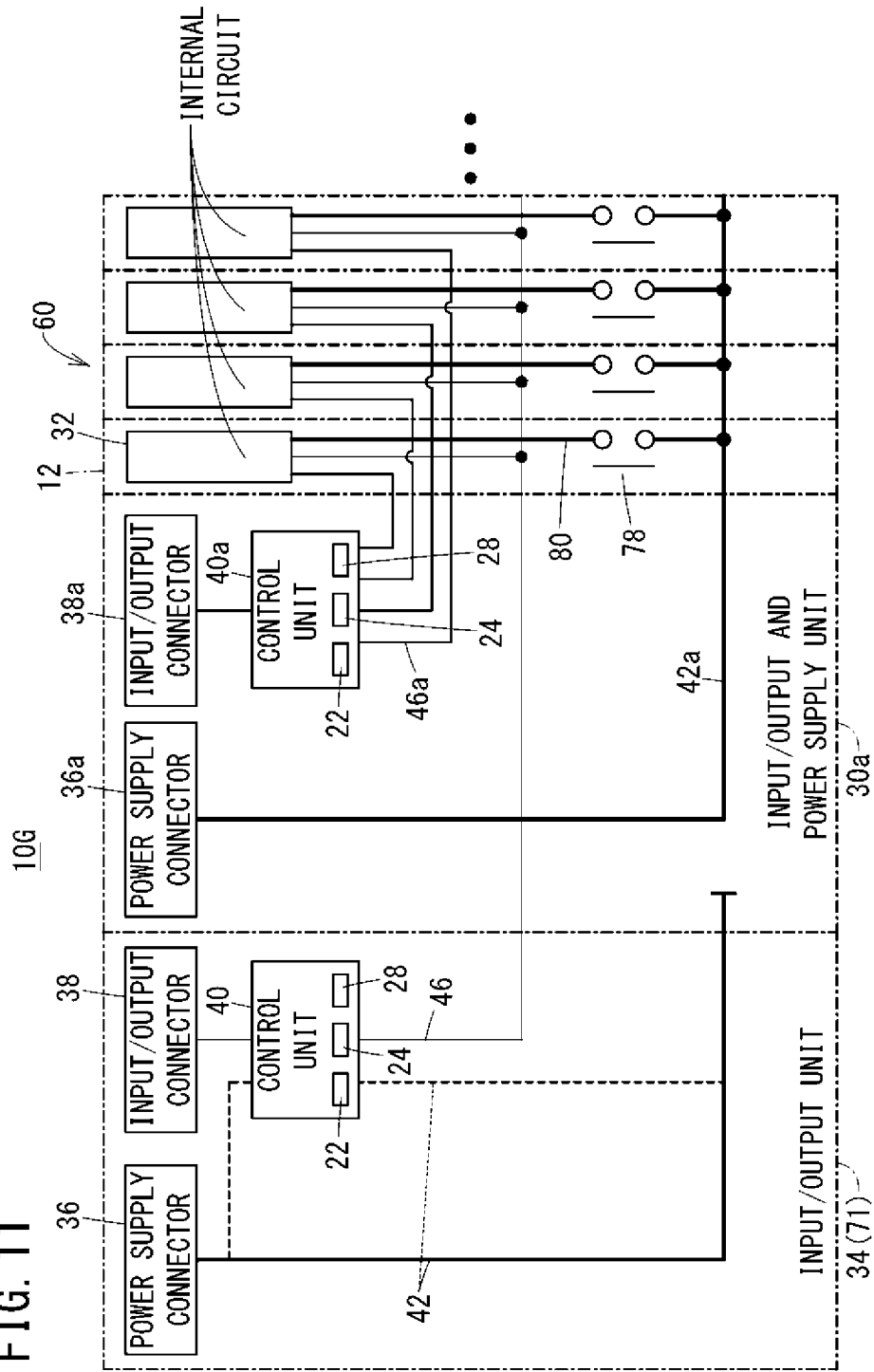
FIG. 11 is a schematic configuration diagram of an actuator control device according to a seventh exemplary embodiment.
Figure 12:
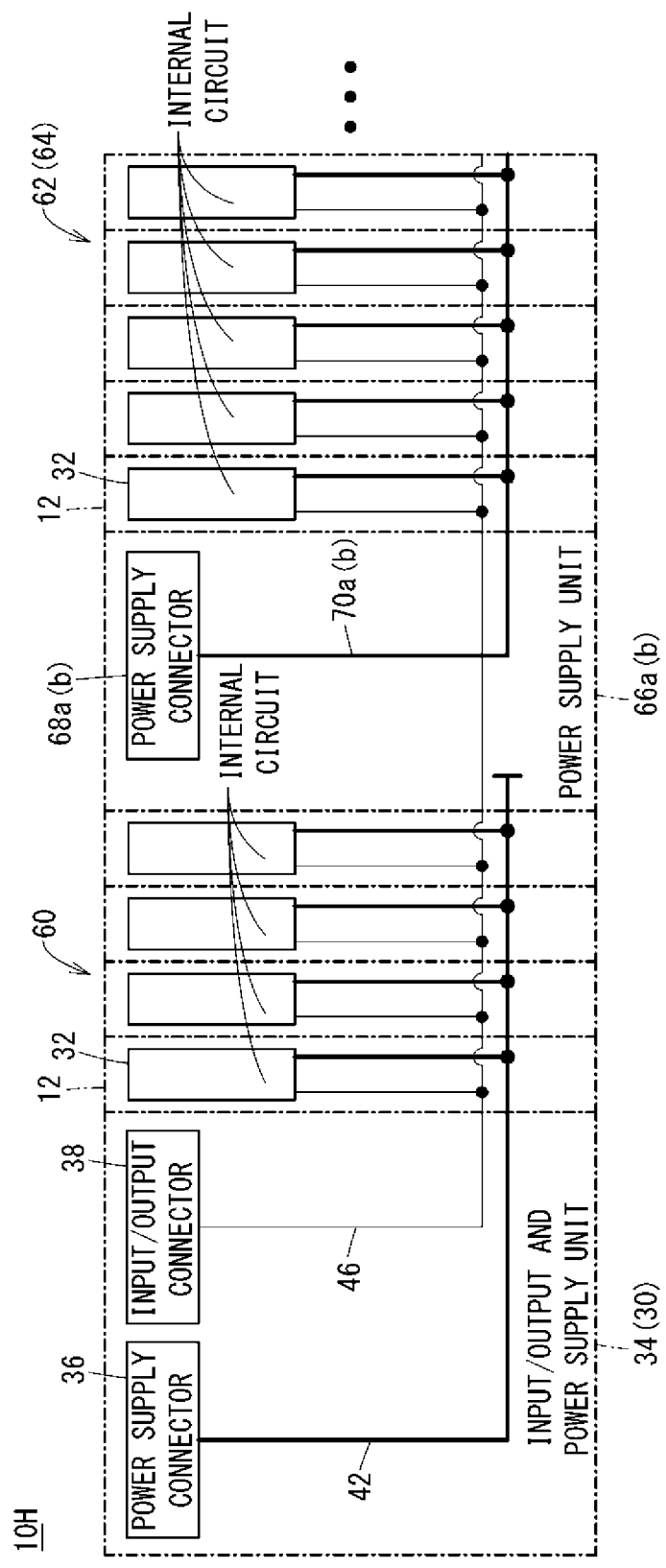
FIG. 12 is a schematic configuration diagram of an actuator control device according to a first modification.
Figure 13:
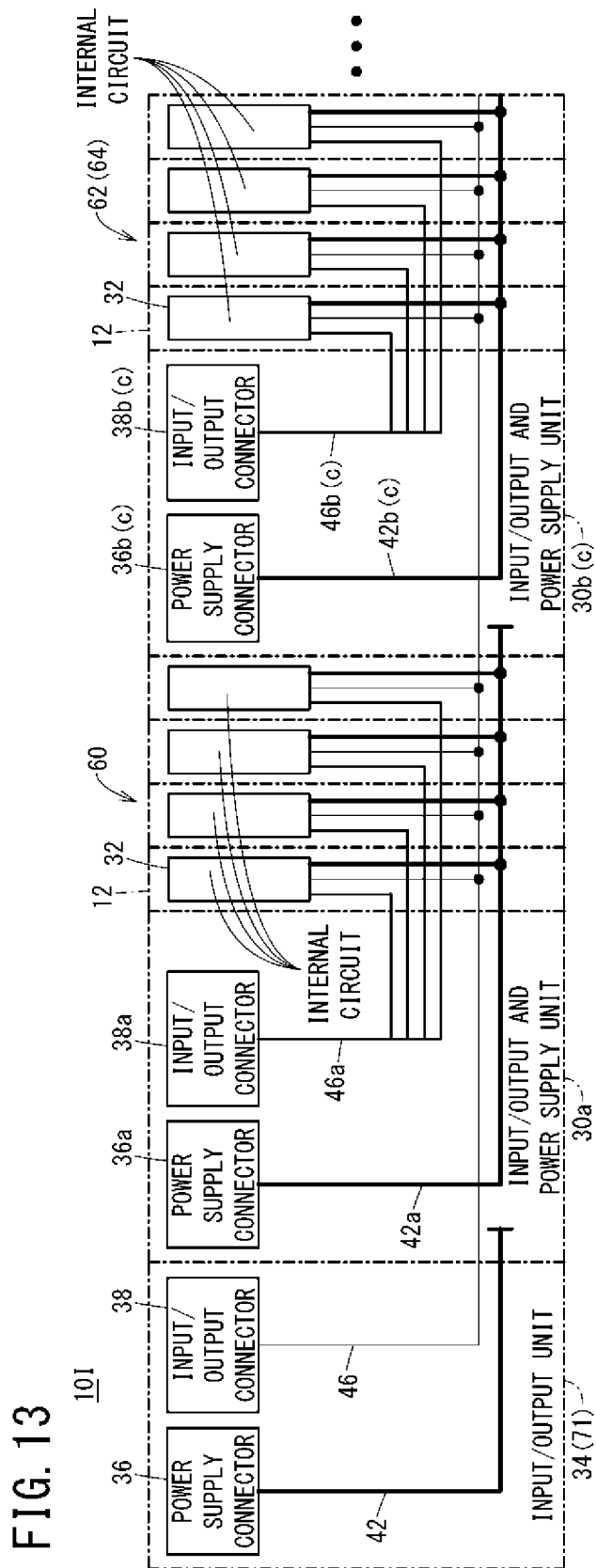
FIG. 13 is a schematic configuration diagram of an actuator control device according to a second modification.
Figure 14:
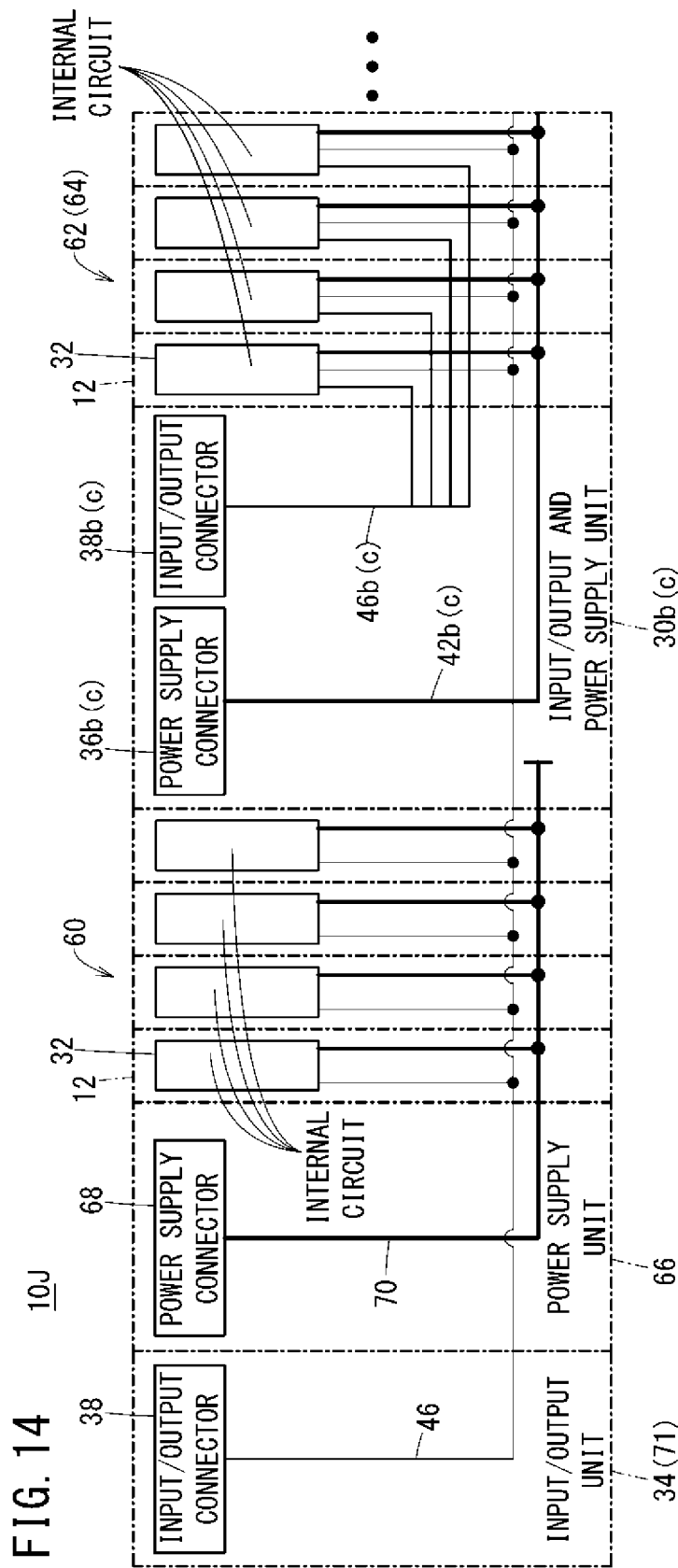
FIG. 14 is a schematic configuration diagram of an actuator control device according to a third modification.
Figure 15:
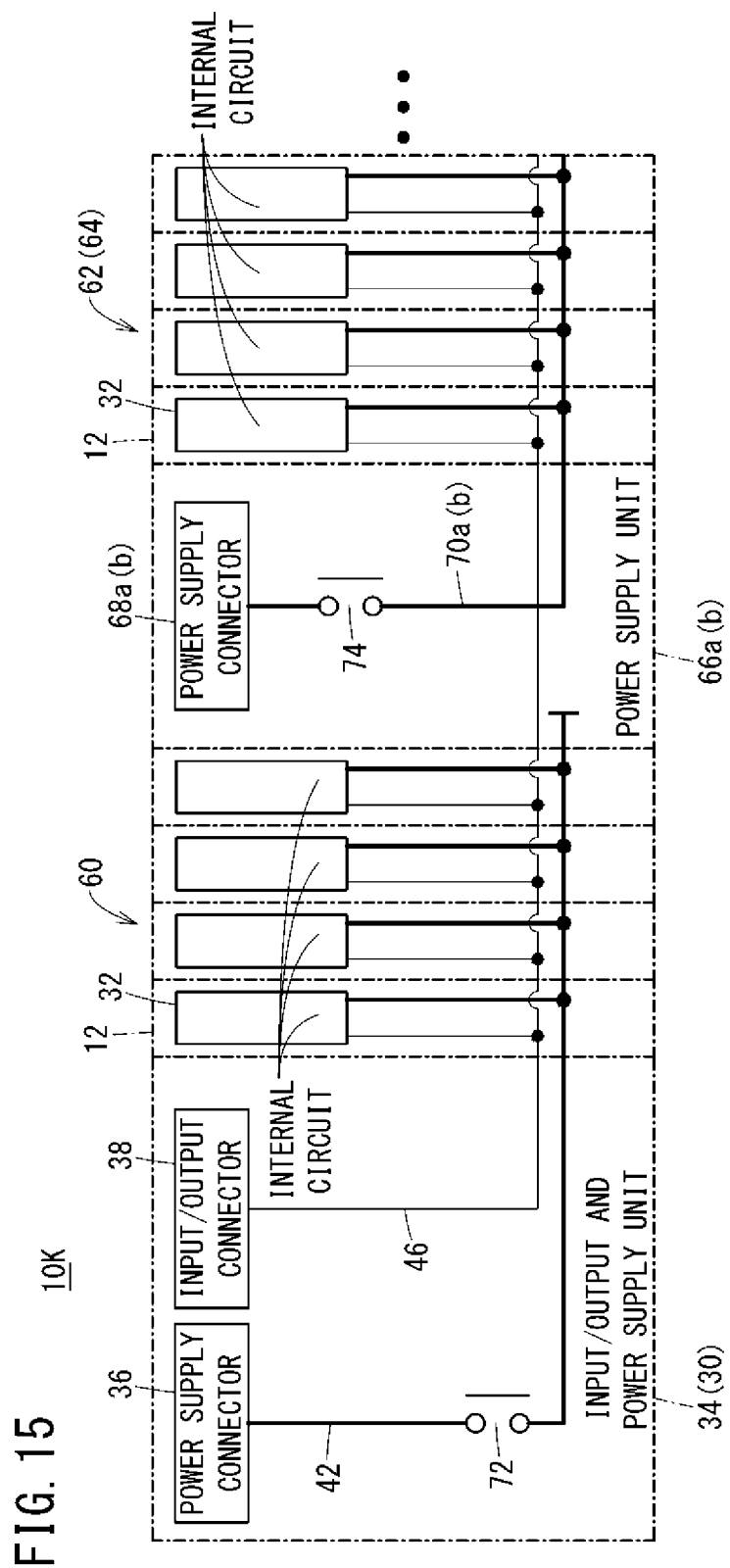
FIG. 15 is a schematic configuration diagram of an actuator control device according to a fourth modification.
Figure 16:
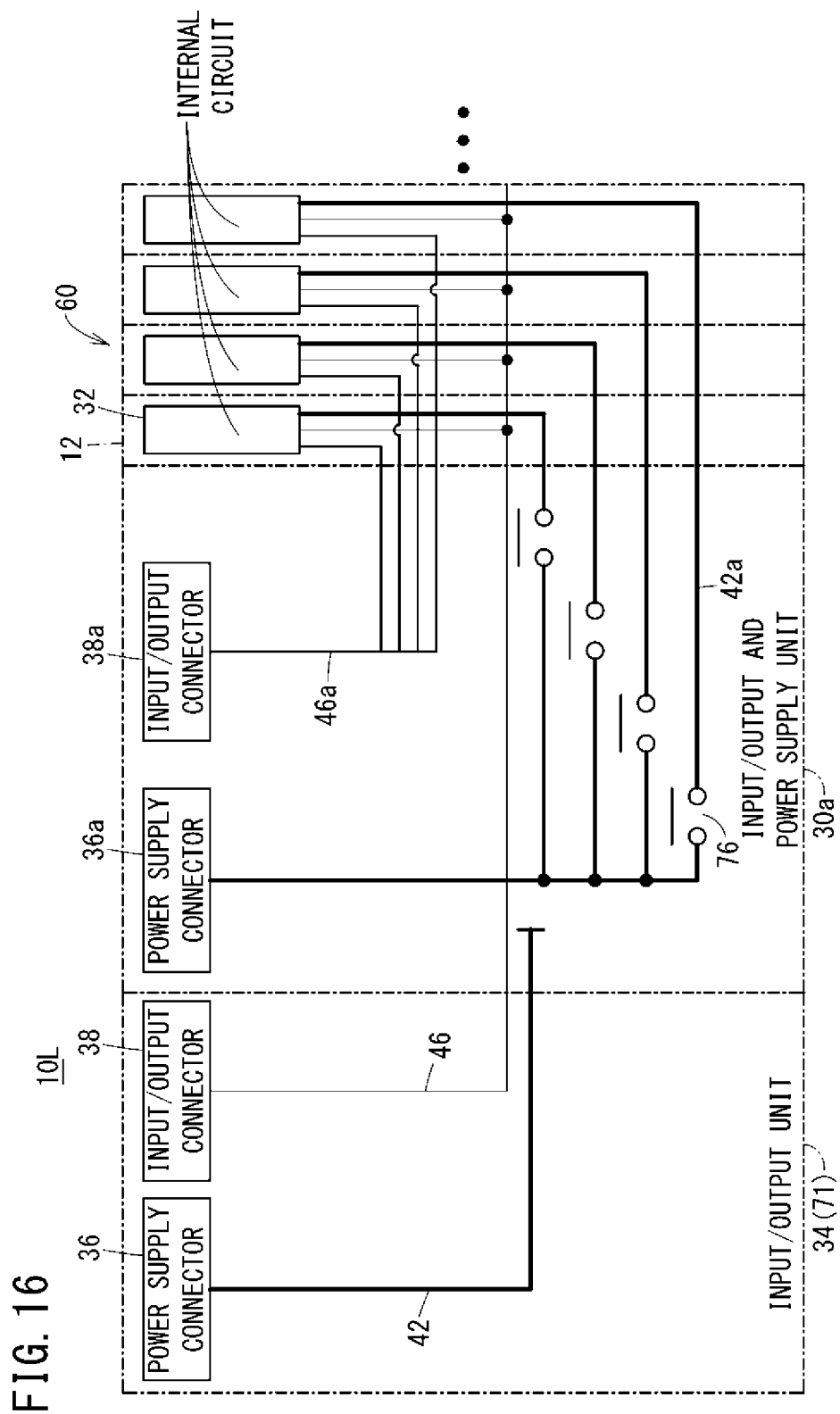
FIG. 16 is a schematic configuration diagram of an actuator control device according to a fifth modification.
Figure 17:
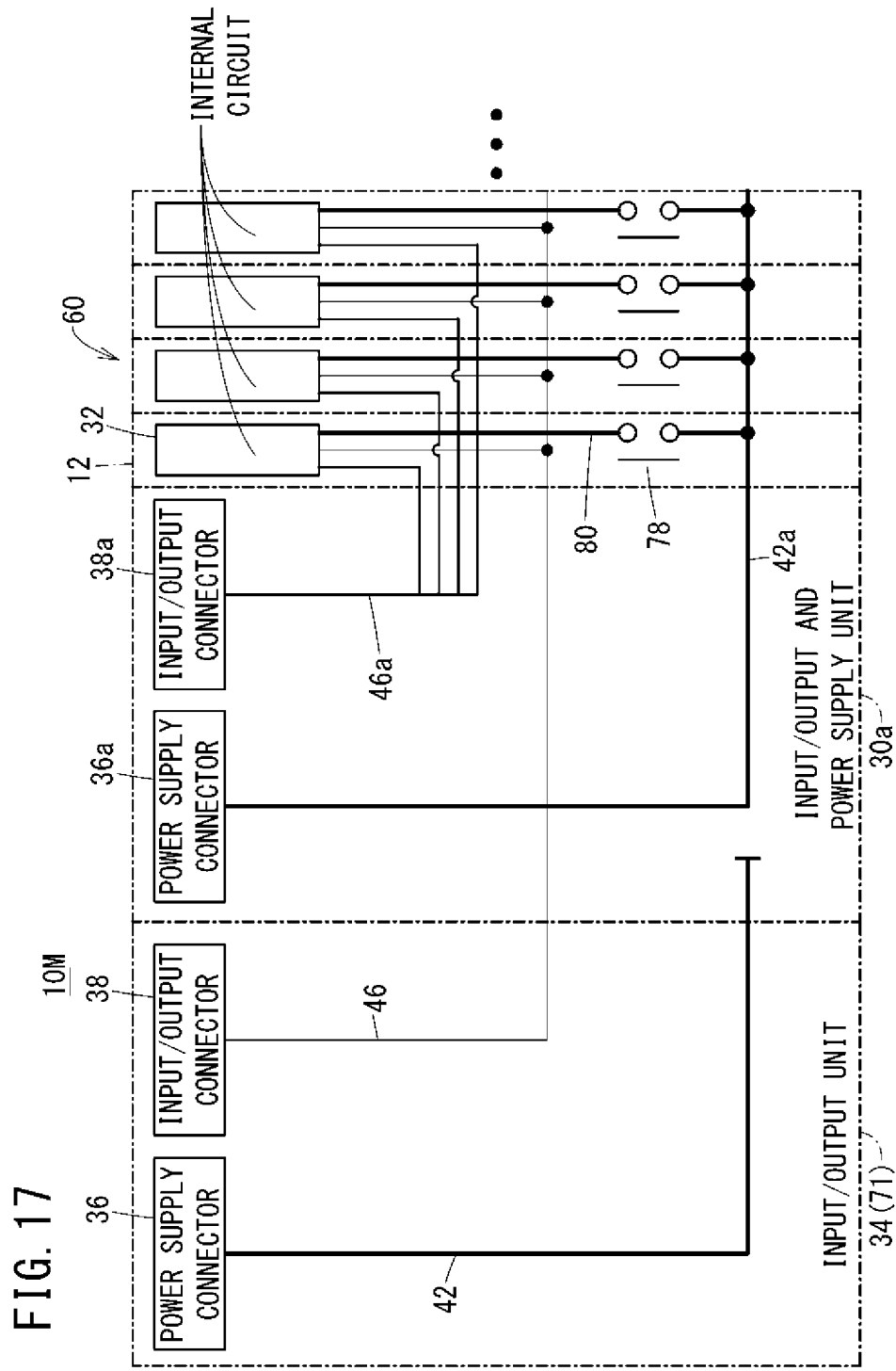
FIG. 17 is a schematic configuration diagram of an actuator control device according to a sixth modification.

FIG. 11 is a schematic configuration diagram of an actuator control device 10G according to a seventh exemplary embodiment. The actuator control device 10G according to the seventh exemplary embodiment differs from the actuator control devices 10C, 10F according to the third and sixth exemplary embodiments (see FIGS. 7A, 7B and 10), in that switches (switching units) 78 are provided in the power supply line 42a inside the respective controller units 12. In this case, the power supply connector 36a extends, via a single power supply line 42a, into the four controller units 12 that constitute the block 60, and switches 78 are respectively provided in branch lines 80 which serve as power supply lines branching from the power supply line 42a and are connected to the respective internal circuits 32.

In this case as well, the respective switches 78 are turned on or off in accordance with a control from the control unit 40a, or alternatively, by operations of the operation switches 58 (see FIG. 5B) made by the user. More specifically, when arbitrary ones of the switches 78 are turned on, electrical power is supplied to the internal circuits 32 connected to the branch lines 80. On the other hand, when arbitrary ones of the switches 78 are turned off, the supply of electrical power to the internal circuits 32 connected to the branch lines 80 is terminated.

6. Other Modifications

In the above description, the power supply connectors 36, 36a to 36c and the input/output connectors 38, 38a to 38c were described as being separate connectors. According to the present embodiment, it is also possible to combine the supply of electrical power and input and output of signals into one connector, for example, as in a D-sub connector.

Further, regarding the upper level unit 34 as well, it is possible to appropriately utilize a wireless unit capable of carrying out wireless communications, a serial unit capable of carrying out serial communications, or a parallel unit capable of carrying out parallel communications with the external device 44 or the like.

Furthermore, in any of the above-described actuator control devices 10, 10A to 10G, using the control units 40, 40a to 40c including (1) the connection confirmation unit 22 and the determination unit 24, (2) the connection confirmation unit 22, the determination unit 24, and the power consumption confirmation unit 28, or (3) the connection confirmation unit 22 and the determination unit 24, or the connection confirmation unit 22, the determination unit 24, and the power consumption confirmation unit 28, it is determined whether or not the current connection state of the controller units 12 and the actuators 16 is a connection state capable of allowing supply of electrical power to the plurality of controller units 12 (whether or not it lies within a permissible value). The present embodiment is not limited to the above-described configurations, and can be configured as in the modifications (first to sixth modifications) shown in FIGS. 12 to 17.

The actuator control devices 10H to 10M according to the first to sixth modifications shown in FIGS. 12 to 17 differ from the actuator control devices 10B to 10G according to the second to seventh exemplary embodiments (see FIGS. 6A to 11), in that the control units 40, 40a to 40c are not included therein. In the actuator control devices 10H to 10M, due to the fact that the control units 40, 40a to 40c are not included, the aforementioned determination processes are not performed. However, since supply of electrical power is carried out with respect to the controller units 12 in each of the blocks 60 to 64, it is possible to avoid an insufficiency in the electrical power that is supplied to the controller units 12 and the actuators 16. Moreover, in the actuator control devices 10I, 10J, 10L, 10M according to the second, third, fifth, and sixth modifications shown in FIGS. 13, 14, 16, and 17, in the same manner as in the actuator control device 10C according to the third exemplary embodiment shown in FIGS. 7A and 7B, the same number of input/output connectors 38a to 38c as in the controller units 12 that make up the block 60 to 64 are provided in each of the input/output and power supply units 30a to 30c. Therefore, each of the respective input/output connectors 38a to 38c is connected via the signal line 46a to 46c to the internal circuit 32 of its corresponding controller unit 12. However, in FIGS. 13, 14, 16 and 17, in order to simplify illustration, it should be noted that only one of the input/output connectors 38a to 38c is shown for each of the input/output and power supply units 30a to 30c.

7. Effects of the Present Embodiments

As has been described above, the actuator control devices 10, 10A to 10G according to the present invention each include the connection confirmation unit 22 that confirms the connection state of the plurality of controller units 12, and the determination unit 24 that determines, on the basis of the confirmation result of the connection confirmation unit 22, whether or not the connection state is in an allowable connection state in which supply of electrical power to the plurality of controller units 12 is allowable.

Consequently, by the user consecutively disposing and connecting a necessary number of the plurality of controller units 12 on the basis of the determination result of the determination unit 24, it becomes possible to control the plurality of actuators 16 which are connected to the plurality of controller units 12. As a result, it is possible to add the plurality of controller units 12 in a manner so that the total power consumption does not exceed the maximum permissible value, while preventing the plurality of controller units 12 from being connected in a wasteful manner, and to supply electrical power to the plurality of controller units 12.

Further, the connection confirmation unit 22 confirms a number of the plurality of controller units 12, and a number of the plurality of actuators 16 that are connected to the plurality of controller units 12, and outputs each of the confirmed numbers (the number of connected devices) as connection information to the determination unit 24. In addition, the determination unit 24 determines whether or not the number of connected devices indicated by the input connection information is less than or equal to a maximum allowable number. Consequently, even in the case that the user increases or decreases the number of connected devices, the determination unit 24 can determine highly accurately whether or not the current connection state is in an allowable connection state in which supply of electrical power to the plurality of controller units 12 is allowable.

Further, the connection confirmation unit 22 obtains the expected total power consumption, and outputs the obtained expected total power consumption as the connection information to the determination unit 24. In addition, the determination unit 24 determines whether or not the expected total power consumption indicated by the input connection information is less than or equal to the maximum allowable power. In accordance with this feature, it is possible to easily predict whether or not the connection state is in an insufficient connection state in which the total power consumption of the plurality of controller units 12 and the plurality of actuators 16 is insufficient due to the increase or decrease in the number of connected devices.

Alternatively, each of the actuator control devices 10, 10A to 10G includes the power consumption confirmation unit 28 that confirms the total actual power consumption, and outputs the confirmation result of the total actual power consumption to the determination unit 24, and the determination unit 24 determines whether or not the total actual power consumption indicated by the input confirmation result is less than or equal to the maximum allowable power. In accordance with this feature, it is possible to accurately and reliably determine whether or not the connection state is in an insufficient connection state in which the total power consumption of the plurality of controller units 12 and the plurality of actuators 16 is insufficient due to the increase or decrease in the number of connected devices.

Further, in the case that the control unit 40 includes at least the connection confirmation unit 22 and the determination unit 24, and controls the plurality of controller units 12, the plurality of controller units 12 are consecutively disposed and connected in one direction (connecting direction). In this case, as in the first to seventh exemplary embodiments, at least one from among the power supply units 66, 66a, 66b, the input/output unit 71, and the input/output and power supply units 30, 30a to 30c is connected to the plurality of controller units 12 that are consecutively disposed and connected in the connecting direction. Consequently, it is possible to easily carry out the supply of electrical power from the power supply units 66, 66a, 66b or the input/output and power supply units 30, 30a to 30c with respect to the plurality of controller units 12 that are consecutively disposed and connected in the connecting direction.

In this case, the input/output and power supply unit 30 or the input/output unit 71 is connected to an upstream side controller unit 12 in the connecting direction from among the plurality of controller units 12, and the connected input/output and power supply unit 30 or the connected input/output unit 71 serves as the upper level unit 34 which is configured to input and output signals to and from the plurality of controller units 12. In accordance with this feature, the upper level unit 34 can carry out, by way of centralized management, input and output of signals with respect to the plurality of controller units 12, as well as the determination process implemented by the determination unit 24. Further, since it is possible to confirm the connection state with the plurality of controller units 12 by the connection confirmation unit 22 that constitutes the control unit 40, it is also possible to specify the individual controller units 12 that are connected to the upper level unit 34.

Furthermore, as in the second to seventh exemplary embodiments, the power supply unit 66, 66a, 66b or the input/output and power supply unit 30a to 30c is interposed between each of an arbitrary number of units from within the plurality of controller units 12, and one of the blocks 60 to 64 is constituted by an arbitrary number of the controller units 12. In this case, the interposed power supply unit 66, 66a, 66b or the interposed input/output and power supply unit 30a to 30c supplies electrical power to the block 60 to 64 that is connected on a downstream side in the connecting direction. In this instance, in the case that the upper level unit 34 is the input/output and power supply unit 30, electrical power is supplied to the block 60 to 64 that is connected on the downstream side. On the other hand, in the case that the upper level unit 34 is the input/output unit 71, the power supply unit 66 or the input/output and power supply unit 30a is interposed between the input/output unit 71 and the block 60 that is connected on the downstream side, and electrical power is supplied from the interposed power supply unit 66 or the interposed input/output and power supply unit 30a to the block 60 that is connected on the downstream side.

Consequently, by supplying electrical power to each of the blocks 60 to 64, the influence of an insufficiency in the supply of electrical power to each of the controller units 12 and the actuators 16 due to an increase or decrease in the number of connected devices of the plurality of controller units 12 and the plurality of actuators 16 can be reduced. Further, since it is possible to perform maintenance or initial adjustments or the like on each of the blocks 60 to 64, a confirmation operation of such maintenance or initial adjustments or the like is facilitated.

In this case, since the interposed input/output and power supply units 30a to 30c are capable of inputting and outputting signals to and from the blocks 60 to 64 connected on the downstream side, it is possible to supply signals to the controller units 12 of each of the blocks 60 to 64, without supplying such signals by way of centralized management from the upper level unit 34. Consequently, it is possible to easily control each of the individual controller units 12 that constitute the blocks 60 to 64, as well as the actuators 16 connected to the controller units 12. As a result, the confirmation operation of such maintenance or initial adjustments can be performed more easily.

Further, as in the fifth to seventh exemplary embodiments, the power supply unit 66, 66a, 66b or the input/output and power supply unit 30, 30a to 30c are equipped with the switches 72 to 78 that turn on and off the supply of electrical power with respect to the blocks 60 to 64 connected on the downstream side. In accordance with this feature, it is possible to turn off the supply of electrical power only for the blocks 60 to 64 that require a confirmation operation such as maintenance or initial adjustments thereon. Therefore, concerning other blocks 60 to 64, by turning on the supply of electrical power thereto, control of the actuators 16 by the controller units 12 is continuously performed. By turning off the supply of electrical power only in a necessary location in this manner, the confirmation operation such as maintenance or initial adjustments can be performed more efficiently and easily. Further, it is also possible to turn on or off the supply of electrical power at only one of the power supply units 66, 66a, 66b or the input/output and power supply units 30, 30a to 30c alone.

Further, as in the actuator control devices 10H to 10M of the first to sixth modifications, even if constituted so as not to include the connection confirmation unit 22, the determination unit 24, the power consumption confirmation unit 28, and the control units 40, 40a to 40c, by supplying electrical power to the controller units 12 of each of the blocks 60 to 64, in each of the blocks 60 to 64, a necessary number of the plurality of controller units 12 are consecutively disposed and connected, and it becomes possible to control the plurality of actuators 16 which are connected to the plurality of controller units 12. In this case as well, it is possible to add the plurality of controller units 12 in a manner so that the total power consumption does not exceed the maximum permissible value, while preventing the plurality of controller units 12 from being connected in a wasteful manner, and to supply electrical power to the plurality of controller units 12.

More specifically, with respect to the plurality of controller units 12 that are consecutively disposed and connected in the connecting direction, supply of electrical power is carried out from the power supply units 66, 66a, 66b or the input/output and power supply units 30, 30a to 30c to each of the blocks 60 to 64, and therefore, the influence of an insufficiency in the supply of electrical power to each of the controller units 12 and the actuators 16 due to an increase or decrease in the respective numbers of the plurality of controller units 12 and the plurality of actuators 16 can be reduced. Further, it becomes possible to perform maintenance or initial adjustments or the like on each of the blocks 60 to 64, and a confirmation operation of such maintenance or initial adjustments or the like is facilitated.

Further, in the actuator control devices 10H to 10M according to the first to sixth modifications as well, since the input/output and power supply unit 30 or the input/output unit 71 is provided as the upper level unit 34, the above-described effects such as performing input and output of signals with respect to the plurality of controller units 12 by way of centralized management can be easily obtained.

Furthermore, in the actuator control devices 10K to 10M according to the fourth to sixth modifications as well, the switches 72 to 78 are provided in the power supply units 66, 66a, 66b or the input/output and power supply units 30, 30a to 30c, and therefore, the aforementioned effects obtained by providing the switches 72 to 78 are easily obtained.

The present invention is not limited to the above-described embodiments, and it goes without saying that various additional or alternative configurations could be adopted therein based on the descriptive content of the present specification.

The invention claimed is:

1. An actuator control device having a plurality of controller units connected to actuators, the controller units being configured to control the actuators that are connected thereto, wherein the actuator control device supplies electrical power to the plurality of actuators via the plurality of controller units, the actuator control device further comprising:
   a connection confirmation unit configured to confirm a connection state of the plurality of controller units; and
   a determination unit configured to determine, based on a confirmation result of the connection confirmation unit, whether or not the connection state is in an allowable connection state in which supply of electrical power to the plurality of controller units is allowable,
   wherein:
   the connection confirmation unit confirms a number of the plurality of controller units, and a number of the plurality of actuators that are connected to the plurality of controller units, and outputs each of the confirmed numbers as connection information to the determination unit; and
   the determination unit determines whether or not each of the numbers indicated by the input connection information is less than or equal to a maximum allowable number.

2. The actuator control device according to claim 1, wherein:
   the connection confirmation unit obtains an expected total power consumption, which is a sum of expected power consumptions of the plurality of controller units and the plurality of actuators corresponding to the respective numbers, and outputs the obtained expected total power consumption as the connection information to the determination unit; and
   the determination unit determines whether the expected total power consumption indicated by the input connection information is less than or equal to a maximum allowable power.

3. The actuator control device according to claim 1, further comprising:
   a power consumption confirmation unit configured to confirm a total actual power consumption, which is a sum of actual power consumptions of the plurality of controller units and the plurality of actuators connected to the plurality of controller units, and to output a confirmation result of the total actual power consumption to the determination unit;
   wherein the determination unit determines whether or not the total actual power consumption indicated by the input confirmation result is less than or equal to a maximum allowable power.

4. The actuator control device according to claim 1, further comprising:
   a control unit including at least the connection confirmation unit and the determination unit, the control unit being configured to control the plurality of controller units;
   wherein the plurality of controller units are consecutively disposed and connected in one direction; and
   at least one from among a power supply unit configured to supply electrical power to the plurality of actuators via the plurality of controller units, an input/output unit equipped with the control unit and configured to perform input and output of signals to and from an exterior and the plurality of controller units, and an input/output and power supply unit configured to serve dually as the power supply unit and the input/output unit, is connected to the plurality of controller units that are consecutively disposed and connected in the one direction.

5. The actuator control device according to claim 4, wherein:
   the input/output and power supply unit or the input/output unit is connected to an upstream side controller unit in a connecting direction from among the plurality of controller units; and
   the connected input/output and power supply unit or the connected input/output unit is an upper level unit configured to input and output signals to and from the plurality of controller units.

6. The actuator control device according to claim 5, wherein:
   the power supply unit or the input/output and power supply unit is interposed between each of an arbitrary number of controller units from within the plurality of controller unit;
   one block is constituted by the arbitrary number of the controller units;
   the interposed power supply unit or the interposed input/output and power supply unit supplies electrical power to the block that is connected on a downstream side in the connecting direction; and
   in a case that the upper level unit is the input/output and power supply unit, electrical power is supplied to the block that is connected on the downstream side, whereas, in a case that the upper level unit is the input/output unit, the power supply unit or the input/output and power supply unit is interposed between the input/output unit and the block that is connected on the downstream side, and electrical power is supplied from the interposed power supply unit or the interposed input/output and power supply unit to the block that is connected on the downstream side.

7. The actuator control device according to claim 6, wherein the interposed input/output and power supply unit is configured to input and output signals to and from the block that is connected on the downstream side.

8. The actuator control device according to claim 6, wherein the power supply unit or the input/output and power supply unit comprises a switching unit configured to turn on and off supply of electrical power with respect to the block connected on the downstream side.

* * * * *